United States Patent
M'Saad et al.

(10) Patent No.: US 6,803,325 B2
(45) Date of Patent: Oct. 12, 2004

(54) APPARATUS FOR IMPROVING BARRIER LAYER ADHESION TO HDP-FSG THIN FILMS

(75) Inventors: Hichem M'Saad, Santa Clara, CA (US); Dana Tribula, Palo Alto, CA (US); Manoj Vellaikal, Santa Clara, CA (US); Farhad Moghadam, Saratoga, CA (US); Sameer Desai, San Francisco, CA (US)

(73) Assignee: Applied Materials Inc., Santa Clara, CA (US)

( * ) Notice: Subject to any disclaimer, the term of this patent is extended or adjusted under 35 U.S.C. 154(b) by 143 days.

(21) Appl. No.: 10/120,713

(22) Filed: Apr. 10, 2002

(65) Prior Publication Data

US 2002/0150682 A1 Oct. 17, 2002

Related U.S. Application Data

(62) Division of application No. 09/569,744, filed on May 11, 2000, now Pat. No. 6,410,457.
(60) Provisional application No. 60/151,855, filed on Sep. 1, 1999.

(51) Int. Cl.[7] ............................. H01L 21/31; H05H 1/24
(52) U.S. Cl. ....................... 438/762; 438/680; 118/697; 118/715; 118/723 R
(58) Field of Search ................................. 438/680, 762, 438/778, 771–792; 118/696, 697, 715–720, 723 R–723 IR

(56) References Cited

U.S. PATENT DOCUMENTS

| | | |
|---|---|---|
| 5,217,570 A | 6/1993 | Kadomura |
| 5,661,093 A | 8/1997 | Ravi et al. |
| 5,739,579 A | 4/1998 | Chiang et al. |
| 5,753,564 A | 5/1998 | Fukada |
| 6,025,264 A | 2/2000 | Yew et al. |
| 6,042,901 A | 3/2000 | Denison et al. |
| 6,121,162 A | 9/2000 | Endo |
| 6,157,083 A | 12/2000 | Usami et al. |
| 6,159,872 A | 12/2000 | Essaian et al. |
| 6,165,915 A | 12/2000 | Jang |
| 6,174,796 B1 | 1/2001 | Takagi et al. |

FOREIGN PATENT DOCUMENTS

| | | |
|---|---|---|
| EP | 0 599 730 A2 | 6/1994 |
| EP | 0 759 481 A1 | 2/1997 |
| EP | 0 883 166 A2 | 12/1998 |
| WO | WO 97/30188 | 8/1997 |

OTHER PUBLICATIONS

Falcony, C., et al., "Low Temperature SiO2 Films," Thin Solid Films, 199 (1991) pp. 269–278.
Falcony, C., et al., "Low Temperature SiO2 Films," Thin Solid Films, 193/194 (1990) pp. 638–647.
Qian, L.Q. et al., "High Density Plasma Deposition and Deep Submicron Gap Fill with Low Dielectric Constant SIOF Films," DUMIC Conference, Feb. 21–22, 1995, pp. 50–58.

*Primary Examiner*—Matthew Smith
*Assistant Examiner*—Calvin Lee
(74) *Attorney, Agent, or Firm*—Townsend and Townsend & Crew

(57) ABSTRACT

A method of formation of a damascene FSG film with good adhesion to silicon nitride in an HDP-CVD system. Silane ($SiH_4$), silicon tetrafluoride ($SiF_4$), oxygen ($O_2$) and argon (Ar) are used as the reactant gases. $SiH_4$, $SiF_4$, and $O_2$ react to form the FSG. Ar is introduced to promote gas dissociation. All four gases are used for depositing most of the FSG film. $SiH_4$ is not used during deposition of the interfacial part of the FSG film. The interfacial part of the FSG film refers either to the topmost portion, if silicon nitride is to be deposited on top of the FSG or the bottom portion if the FSG is to be deposited on top of silicon nitride. Using $SiH_4$ with the $SiF_4$ tends to mitigate the destructive effects of $SiF_4$ throughout most of the deposition. By removing the $SiH_4$ from the deposition of the interfacial part of the FSG film less hydrogen is incorporated into the film in the interfacial region and adhesion to overlying or underlying silicon nitride is improved.

7 Claims, 14 Drawing Sheets

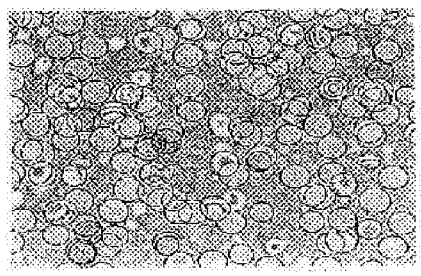
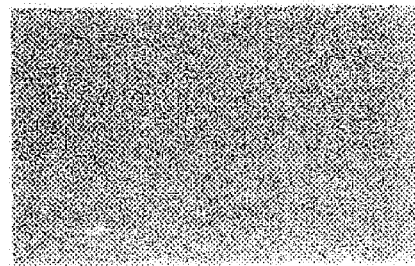
FIG. 8A.  FIG. 8B.
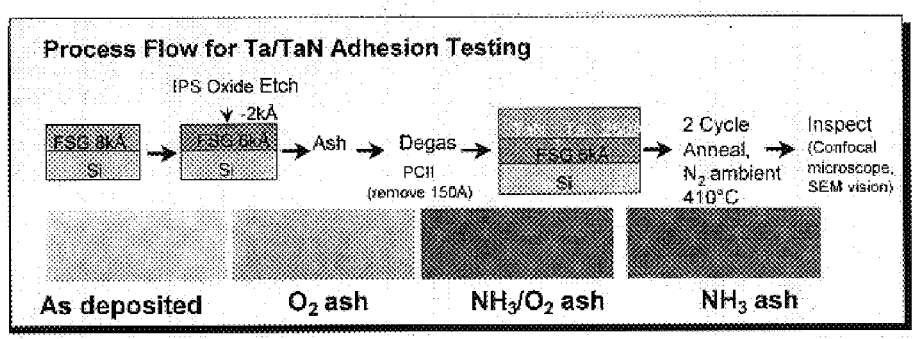
FIG. 11.

APPARATUS FOR IMPROVING BARRIER LAYER ADHESION TO HDP-FSG THIN FILMS

CROSS REFERENCE TO RELATED APPLICATIONS

This application claims the priority of Provisional Application No. 60/151,855, filed Sep. 1, 1999, which is herein incorporated by reference for all purposes. This application is a divisional application of U.S. Appl. No. 09/569,744 filed May 11, 2000, and issued as U.S. Pat. No. 6,410,457, the entire disclosure of which is herein incorporated by reference for all purposes.

BACKGROUND OF THE INVENTION

The present invention relates to the manufacture of integrated circuits, and more specifically, to a method of forming fluorinated silicate glass ("FSG") films with good adhesion to silicon nitride in a high-density-plasma chemical-vapor-deposition ("HDP-CVD") system.

In conventional integrated circuit fabrication, circuit elements are formed by etching a pattern of gaps in a layer of metal such as aluminum. The gaps are then filled with a dielectric such as silicon dioxide. Copper is poised to take over as the main on-chip conductor for all types of integrated circuits because of its lower resistance when compared to conventional aluminum alloys. Because it is difficult to etch copper, however, damascene processes have been developed for fabricating copper based integrated circuits. In damascene processes, dielectric layers are deposited and then etched to form gaps that are subsequently filled with copper.

Fluorine-doped silicon oxide, also known as fluorosilicate glass, is an attractive solution to replace conventional silicon dioxide as an intermetal dielectric for damascene structures. An FSG film can be deposited in conventional HDP-CVD systems, which have been widely used for undoped silicate glass (USG) and FSG dielectrics in aluminum interconnects. FSG has a good process scheme in terms of reliability, stability, and throughput. Furthermore, the electrical performance of integrated circuits can be improved because of the lower dielectric constant of FSG (3.4 compared to 4.1 for conventional silicon oxides). The lower dielectric constant reduces the capacitance between metal lines in the same layer and reduces cross talk across layers.

Dielectric films used in damascene processes utilize a layer known as an etch stop to provide for selective etching of the film. Silicon nitride ($Si_xN_y$) is commonly used as an etch stop in damascene applications, for example when forming vias between layers containing metal lines. In the past, there have been problems in obtaining good adhesion between the silicon nitride and an underlying or overlying layer of FSG. Specifically, the FSG tends to outgas at temperatures of about 450° C. forming "bubbles" in an overlying $Si_xN_y$ layer. The bubbles lead to delamination of the $Si_xN_y$. Previous attempts to improve the adhesion by, for example, reducing the fluorine content in the FSG merely postpone the delamination. When FSG films are deposited on a silicon nitride barrier layer in damascene or dual damascene applications, failure to integrate the FSG with the barrier layer poses a significant obstacle in the widespread acceptance of FSG as an adequate low-k dielectric material.

Therefore, a need exists in the art for a method of depositing an FSG film with improved adhesion to an overlying or underlying layer of silicon nitride.

SUMMARY OF THE INVENTION

The disadvantages associated with the prior art are overcome by a method of formation of the damascene FSG film with good adhesion to silicon nitride. In one embodiment of the present invention, a multilayer FSG film is deposited as part of a film stack that includes an adjacent silicon nitride layer. The multilayer FSG film includes an interfacial FSG layer and a bulk FSG layer. The "interfacial FSG layer" refers to the portion of the FSG film deposited adjacent to the silicon nitride layer. Thus, the interfacial part of the FSG film refers to the topmost portion if silicon nitride is to be deposited on top of the FSG and it refers to the bottom portion if the FSG is to be deposited on top of silicon nitride. It is not required that the "bulk FSG layer" be thicker than the interfacial layer, although it may be in some embodiments. The multilayer FSG film is deposited by flowing a gaseous mixture comprising flows of silane, a gas that contains both fluorine and silicon, and a gas that contains oxygen to a process chamber. The gas that contains both fluorine and silicon is preferably $SiF_4$, and the gas that contains oxygen is preferably $O_2$. It is also preferable that the gaseous mixture comprise a flow of inert gas, such as Ar, to promote gas dissociation. A plasma, preferably a high-density plasma is generated from the gaseous mixture, and the bulk portion of an FSG layer is deposited on the substrate using the plasma. The silane flow is then terminated during deposition of the interfacial part of the FSG film. By removing the $SiH_4$ from the deposition of the interfacial part of the FSG film, less hydrogen is incorporated into the film in the interfacial region and adhesion to overlying or underlying silicon nitride is improved. In other embodiments, a multilayer FSG film that includes bottom and top interfacial layers sandwiched around a bulk FSG layer is formed.

In another embodiment, a pure $SiF_4$-only fluorinated oxide ("SOFO") layer is deposited without having any portion of the film formed with silane. In this embodiment, a gaseous mixture is provided that comprises flows of a gas that contains both fluorine and silicon and a gas that contains oxygen, but not containing a silane, for the entire deposition. It is again preferred that gaseous mixture comprise a flow of inert gas, such as Ar, and that the gas containing both fluorine and silicon be $SiF_4$ and that the gas containing oxygen be $O_2$. In further embodiments, the SOFO layer is deposited as part of a copper damascene process on a barrier layer, preferably silicon nitride, previously formed on the substrate. In still other embodiments, the SOFO layer is etched, ashed, and metallized. The ashing is preferably performed with an oxygen, ammonia, or mixed oxygen-ammonia chemistry, and the metallization layer is preferably formed of Ta or TaN.

The methods of the present invention may be embodied in a computer-readable storage medium having a computer-readable program embodied therein for directing operation of a substrate processing system. Such a system may include a process chamber, a plasma generation system, a substrate holder, a gas delivery system, and a system controller. The computer-readable program includes instructions for operating the substrate processing system to form a thin film on a substrate disposed in the processing chamber in accordance with the embodiments described above.

BRIEF DESCRIPTION OF THE DRAWINGS

FIG. 8(a) shows a confocal view of an HDP-CVD FSG/$Si_xN_y$ structure after two annealing cycles, exhibiting circular bubbles;

FIG. 8(b) shows a confocal view of an HDP-CVD SOFO/$Si_xN_y$ structure after 12 annealing cycles, exhibiting no evidence of delamination;

FIG. 11 is a schematic representation of the process flow for SOFO integration with etching, ashing, and metallization.

DESCRIPTION OF THE SPECIFIC EMBODIMENTS

I. Introduction

Embodiments of the present invention deposit fluorinated silicate glass (FSG) in such a manner that it strongly adheres to an overlying or underlying barrier layer such as silicon nitride ($Si_xN_y$). In one embodiment, silane ($SiH_4$), silicon tetrafluoride ($SiF_4$), oxygen ($O_2$), and argon (Ar) are used as the reactant gases. $SiH_4$, $SiF_4$, and $O_2$ react to form the FSG. Ar is included to promote gas dissociation. All four gases may be used for the majority of the deposition. However, for at least the interfacial part of the deposition, and for the entire film in certain embodiments, $SiH_4$ is not used. Material thus deposited without the use of silane is referred to herein alternatively as "$SiF_4$-only FSG" or "$SiF_4$-only fluorinated oxide" ("SOFO"). FSG deposited with silane is referred to herein as $SiH_4$-FSG. The interfacial part of the deposition refers either to the latter or topmost portion of the deposition, if silicon nitride is to be deposited over the FSG. Alternatively, the interfacial portion may be the initial or lowermost portion of the deposition if the FSG is to be deposited over a barrier layer such as silicon nitride.

The presence of $SiH_4$ during deposition incorporates some hydrogen into the FSG film as an impurity. It is not clear by what mechanism the presence of hydrogen in the FSG degrades the adhesion of the FSG to $Si_xN_y$. It is believed that the poor adhesion and consequent delamination are related to the increased diffusivity of hydrogen in FSG at temperatures of 400° C. or greater.

In an alternative embodiment of the method of the present invention, FSG is deposited using only $SiF_4$, $O_2$ and Ar throughout the deposition without using $SiH_4$ for any part of the deposition. Although good adhesion to $Si_xN_y$ and lower dielectric constant may be obtained this way, FSG deposition using $SiF_4$ without $SiH_4$ has a lower deposition rate than FSG deposition with both $SiF_4$ and $SiH_4$.

II. Exemplary Substrate Processing System

Figure 1A:
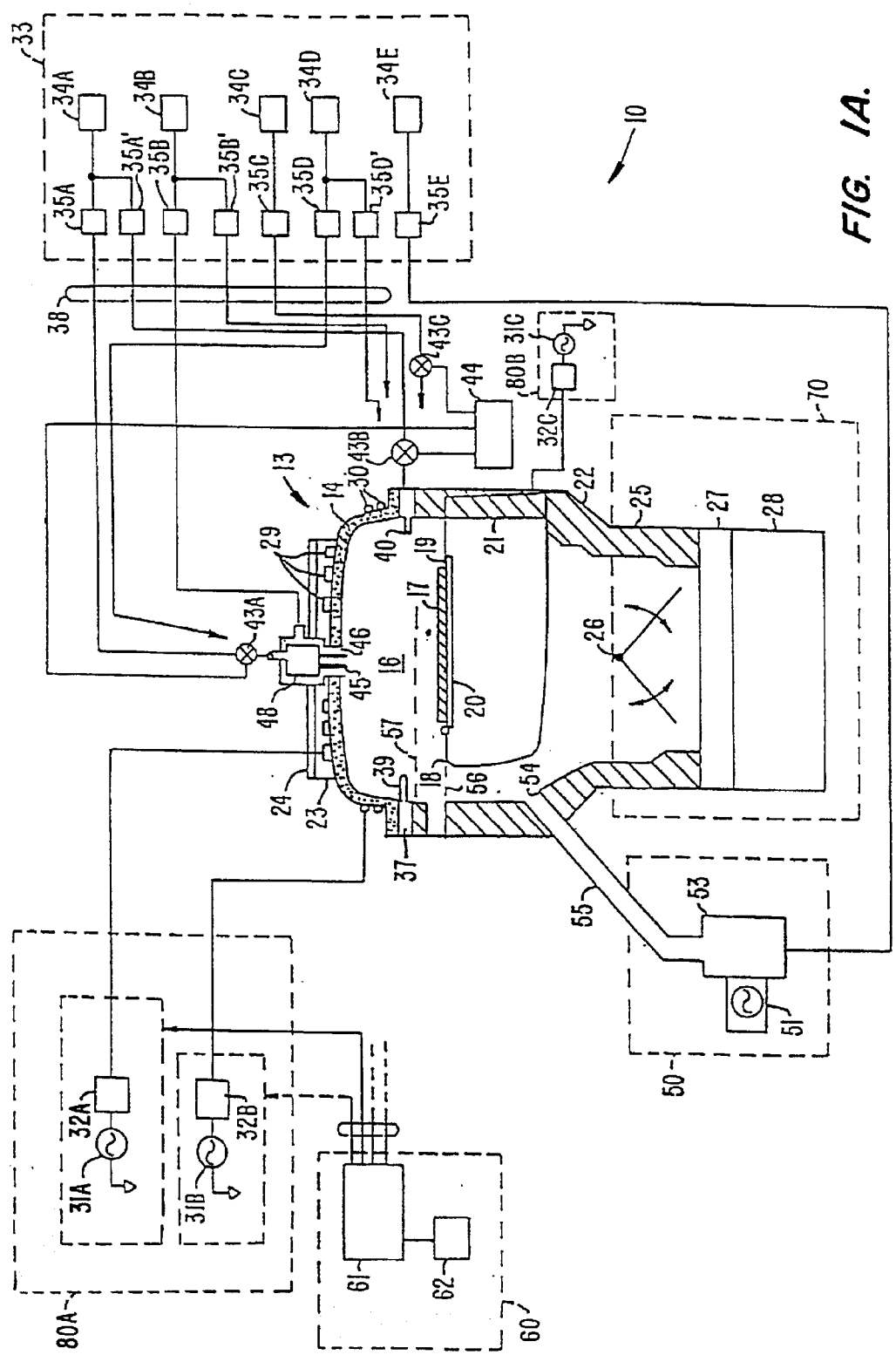
FIG. 1A is a simplified diagram of one embodiment of a high-density plasma chemical vapor deposition system according to the present invention.

FIG. 1A illustrates one embodiment of a high density plasma chemical vapor deposition (HDP-CVD) system 10 in which a dielectric layer according to the present invention can be deposited. System 10 includes a chamber 13, a vacuum system 70, a source plasma system 80A, a bias plasma system 80B, a gas delivery system 33, and a remote plasma cleaning system 50.

The upper portion of chamber 13 includes a dome 14, which is made of a ceramic dielectric material, such as aluminum oxide or aluminum nitride. Dome 14 defines an upper boundary of a plasma processing region 16. Plasma processing region 16 is bounded on the bottom by the upper surface of a substrate 17 and a substrate support member 18.

A heater plate 23 and a cold plate 24 surmount, and are thermally coupled to, dome 14. Heater plate 23 and cold plate 24 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 13 includes a body member 22, which joins the chamber to the vacuum system. A base portion 21 of substrate support member 18 is mounted on, and forms a continuous inner surface with, body member 22. Substrates are transferred into and out of chamber 13 by a robot blade (not shown) through an insertion/removal opening (not shown) in the side of chamber 13. Lift pins (not shown) are raised and then lowered under the control of a motor (also not shown) to move the substrate from the robot blade at an upper loading position 57 to a lower processing position 56 in which the substrate is placed on a substrate receiving portion 19 of substrate support member 18. Substrate receiving portion 19 includes an electrostatic chuck 20 that secures the substrate to substrate support member 18 during substrate processing. In a preferred embodiment, substrate support member 18 is made from an aluminum oxide or aluminum ceramic material.

Vacuum system 70 includes throttle body 25, which houses twin-blade throttle valve 26 and is attached to gate valve 27 and turbo-molecular pump 28. It should be noted that throttle body 25 offers minimum obstruction to gas flow, and allows symmetric pumping. Gate valve 27 can isolate pump 28 from throttle body 25, and can also control chamber pressure by restricting the exhaust flow capacity when throttle valve 26 is fully open. The arrangement of the throttle valve, gate valve, and turbo-molecular pump allow accurate and stable control of chamber pressures from between about 1 millitorr to about 2 torr.

The source plasma system 80A includes a top coil 29 and side coil 30, mounted on dome 14. A symmetrical ground shield (not shown) reduces electrical coupling between the coils. Top coil 29 is powered by top source RF (SRF) generator 31A, whereas side coil 30 is powered by side SRF generator 31B, allowing independent power levels and frequencies of operation for each coil. This dual coil system allows control of the radial ion density in chamber 13, thereby improving plasma uniformity. Side coil 30 and top coil 29 are typically inductively driven, which does not require a complimentary electrode. In a specific embodiment, the top source RF generator 31A provides up to 2,500 watts of RF power at nominally 2 MHz and the side source RF generator 31B provides up to 5,000 watts of RF power at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 80B includes a bias RF ("BRF") generator 31C and a bias matching network 32C. The bias plasma system 80B capacitively couples substrate portion 17 to body member 22, which act as complimentary electrodes. The bias plasma system 80B serves to enhance the transport of plasma species (e.g., ions) created by the source plasma system 80A to the surface of the substrate. In a specific embodiment, bias RF generator provides up to 5,000 watts of RF power at 13.56 MHz.

RF generators 31A and 31B include digitally-controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 32A and 32B match the output impedance of generators 31A and 31B with their respective coils 29 and 30. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 1B:
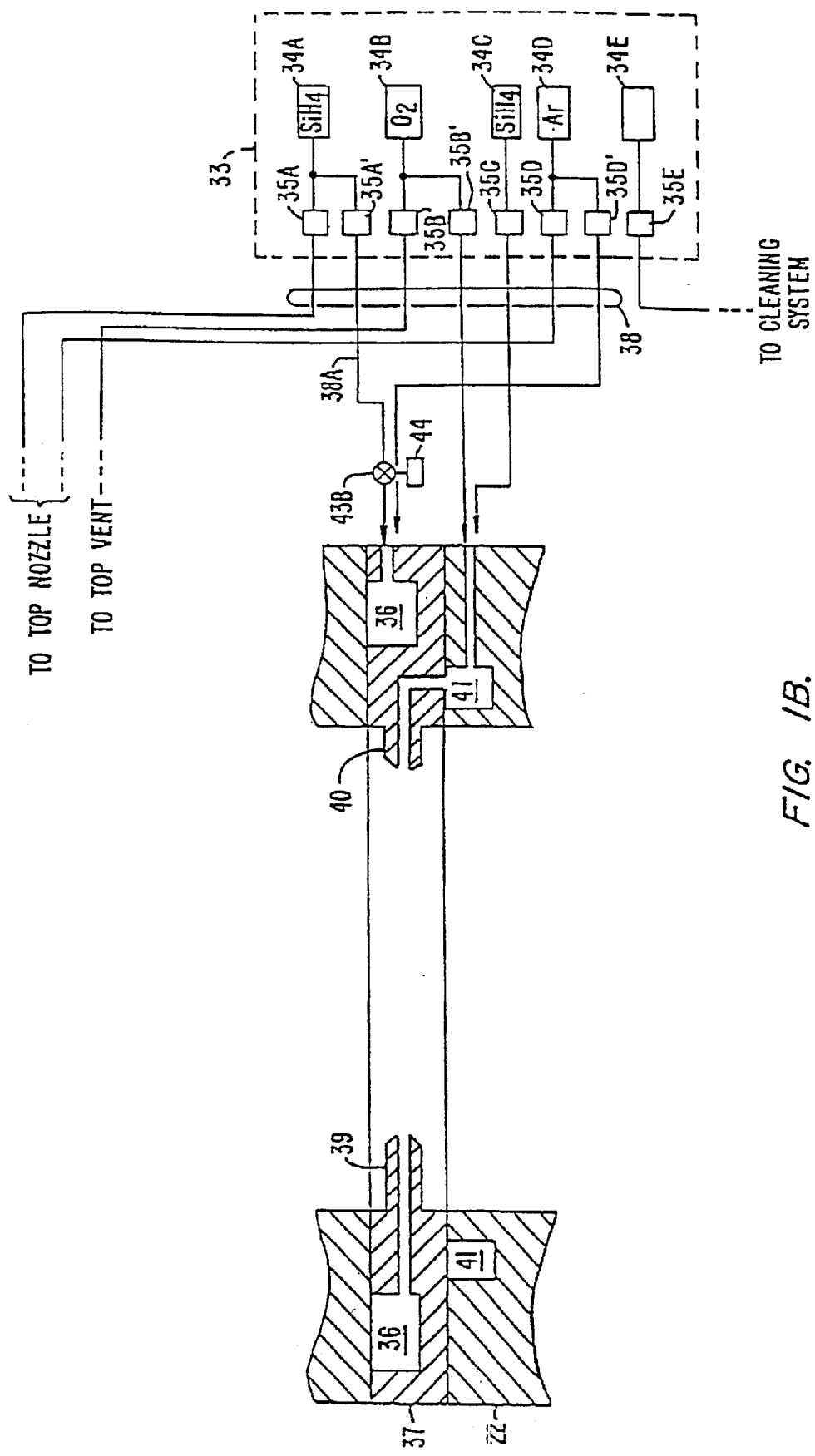
FIG. 1B is a simplified cross section of a gas ring that may be used in conjunction with the exemplary CVD processing chamber of FIG. 1A.

A gas delivery system 33 provides gases from several sources, 34A–34E chamber for processing the substrate via gas delivery lines 38 (only some of which are shown). As would be understood by a person of skill in the art, the actual sources used for sources 34A–34E and the actual connection of delivery lines 38 to chamber 13 varies depending on the deposition and cleaning processes executed within chamber 13. Gases are introduced into chamber 13 through a gas ring 37 and/or a top nozzle 45. FIG. 1B is a simplified, partial cross-sectional view of chamber 13 showing additional details of gas ring 37.

In one embodiment, first and second gas sources, 34A and 34B, and first and second gas flow controllers, 35A' and 35B', provide gas to ring plenum 36 in gas ring 37 via gas delivery lines 38 (only some of which are shown). Gas ring 37 has a plurality of source gas nozzles 39 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 37 has 12 source gas nozzles made from an aluminum oxide ceramic.

Gas ring 37 also has a plurality of oxidizer gas nozzles 40 (only one of which is shown), which in a preferred embodiment are co-planar with and shorter than source gas nozzles 39, and in one embodiment receive gas from body plenum 41. In some embodiments it is desirable not to mix source gases and oxidizer gases before injecting the gases into chamber 13. In other embodiments, oxidizer gas and source gas may be mixed prior to injecting the gases into chamber 13 by providing apertures (not shown) between body plenum 41 and gas ring plenum 36. In one embodiment, third and fourth gas sources, 34C and 34D, and third and fourth gas flow controllers, 35C and 35D', provide gas to body plenum via gas delivery lines 38. Additional valves, such as 43B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 43B, to isolate chamber 13 from delivery line 38A and to vent delivery line 38A to vacuum foreline 44, for example. As shown in FIG. 1A, other similar valves, such as 43A and 43C, may be incorporated on other gas delivery lines. Such 3-way valves may be placed as close to chamber 13 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 1A, chamber 13 also has top nozzle 45 and top vent 46. Top nozzle 45 and top vent 46 allow independent control of top and side flows of the gases, which improves film uniformity and allows fine adjustment of the film's deposition and doping parameters. Top vent 46 is an annular opening around top nozzle 45. In one embodiment, first gas source 34A supplies source gas nozzles 39 and top nozzle 45. Source nozzle MFC 35A' controls the amount of gas delivered to source gas nozzles 39 and top nozzle MFC 35A controls the amount of gas delivered to top gas nozzle 45. Similarly, two MFCs 35B and 35B' may be used to control the flow of oxygen to both top vent 46 and oxidizer gas nozzles 40 from a single source of oxygen, such as source 34B. The gases supplied to top nozzle 45 and top vent 46 may be kept separate prior to flowing the gases into chamber 13, or the gases may be mixed in top plenum 48 before they flow into chamber 13. Separate sources of the same gas may be used to supply various portions of the chamber.

A remote microwave-generated plasma cleaning system 50 is provided to periodically clean deposition residues from chamber components. The cleaning system includes a remote microwave generator 51 that creates a plasma from a cleaning gas source 34E (e.g., molecular fluorine, nitrogen trifluoride, other fluorocarbons or equivalents) in reactor cavity 53. The reactive species resulting from this plasma are conveyed to chamber 13 through cleaning gas feed port 54 via applicator tube 55. The materials used to contain the cleaning plasma (e.g., cavity 53 and applicator tube 55) must be resistant to attack by the plasma. The distance between reactor cavity 53 and feed port 54 should be kept as short as practical, since the concentration of desirable plasma species may decline with distance from reactor cavity 53. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 20, do not need to be covered with a dummy wafer or otherwise protected, as may be required with an in situ plasma cleaning process.

System controller 60 controls the operation of system 10. In a preferred embodiment, controller 60 includes a memory 62, such as a hard disk drive, a floppy disk drive (not shown), and a card rack (not shown) coupled to a processor 61. The card rack may contain a single-board computer (SBC) (not shown), analog and digital input/output boards (not shown), interface boards (not shown), and stepper motor controller boards (not shown). The system controller conforms to the Versa Modular European ("VME") standard, which defines board, card cage, and connector dimensions and types. The VME standard also defines the bus structure as having a 16-bit data bus and 24-bit address bus. System controller 60 operates under the control of a computer program stored on the hard disk drive or through other computer programs, such as programs stored on a removable disk. The computer program dictates, for example, the timing, mixture of gases, RF power levels and other parameters of a particular process. The interface between a user and the system controller is via a monitor, such as a cathode ray tube ("CRT") 65, and a light pen 66, as depicted in FIG. 1C.

Figure 1C:
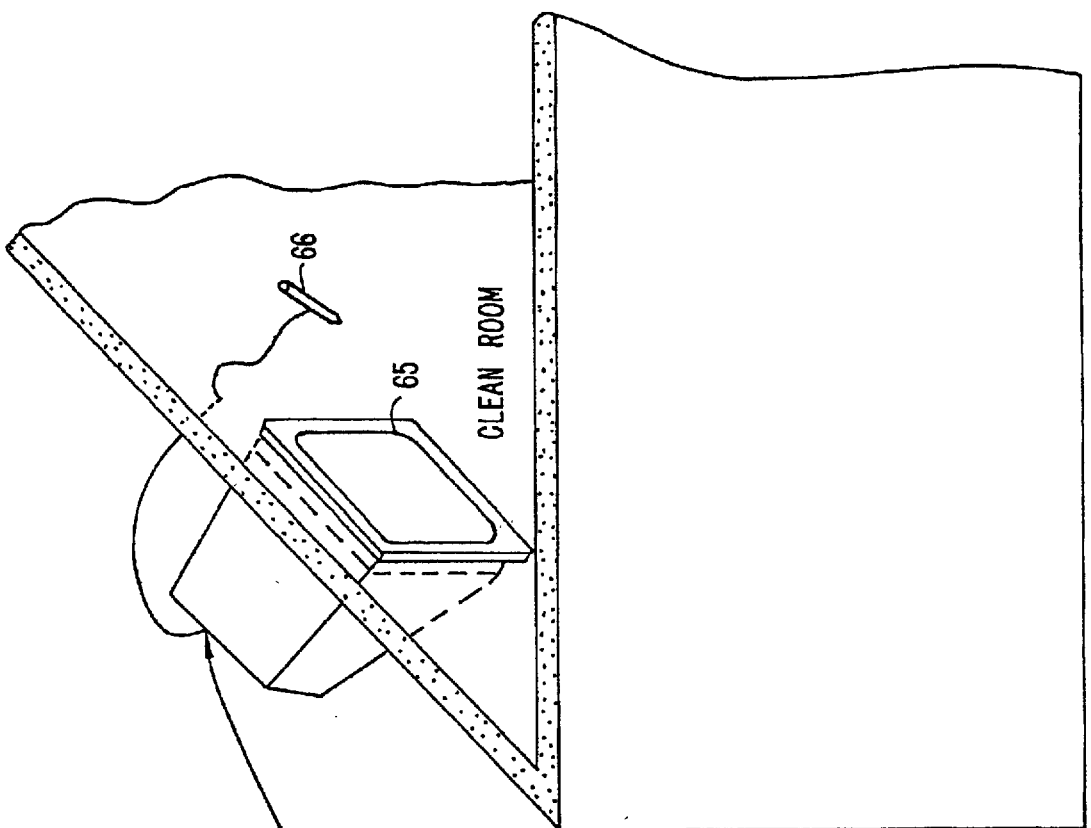
FIG. 1C is a simplified diagram of a monitor and light pen that may be used in conjunction with the exemplary CVD processing chamber of FIG. 1A.
Figure 1C:
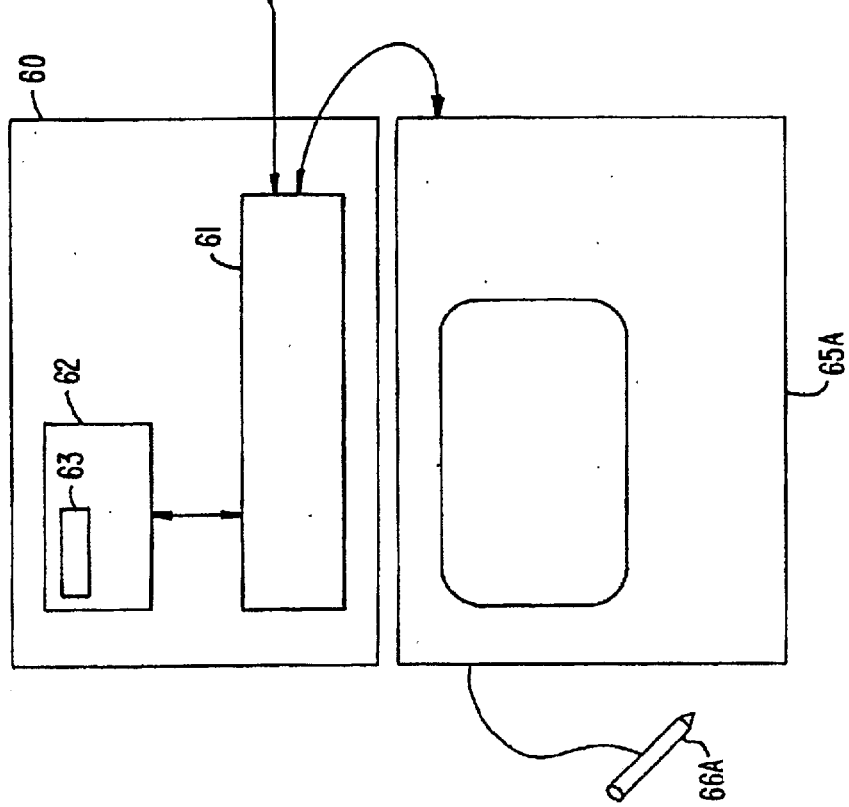

FIG. 1C is an illustration of a portion of an exemplary system user interface used in conjunction with the exemplary CVD processing chamber of FIG. 1A. System controller 60 includes a processor 61 coupled to a computer-readable memory 62. Preferably, memory 62 may be a hard disk drive, but memory 62 may be other kinds of memory, such as ROM, PROM, and others.

System controller 60 operates under the control of a computer program 63 stored in a computer-readable format within memory 62. The computer program dictates the timing, temperatures, gas flows, RF power levels and other parameters of a particular process. The interface between a user and the system controller is via a CRT monitor 65 and a light pen 66, as depicted in FIG. 1C. In a preferred embodiment, two monitors, 65 and 65A, and two light pens, 66 and 66A, are used, one mounted in the clean room wall (65) for the operators and the other behind the wall (65A) for the service technicians. Both monitors simultaneously display the same information, but only one light pen (e.g. 66) is enabled. To select a particular screen or function, the operator touches an area of the display screen and pushes a button (not shown) on the pen. The touched area confirms being selected by the light pen by changing its color or displaying a new menu, for example.

The computer program code can be written in any conventional computer-readable programming language such as 68000 assembly language, C, C++, or Pascal. Suitable program code is entered into a single file, or multiple files, using a conventional text editor and is stored or embodied in a computer-usable medium, such as a memory system of the computer. If the entered code text is in a high level language, the code is compiled, and the resultant compiler code is then linked with an object code of precompiled windows library routines. To execute the linked compiled object code, the system user invokes the object code causing the computer system to load the code in memory. The CPU reads the code from memory and executes the code to perform the tasks identified in the program.

Figure 1D:
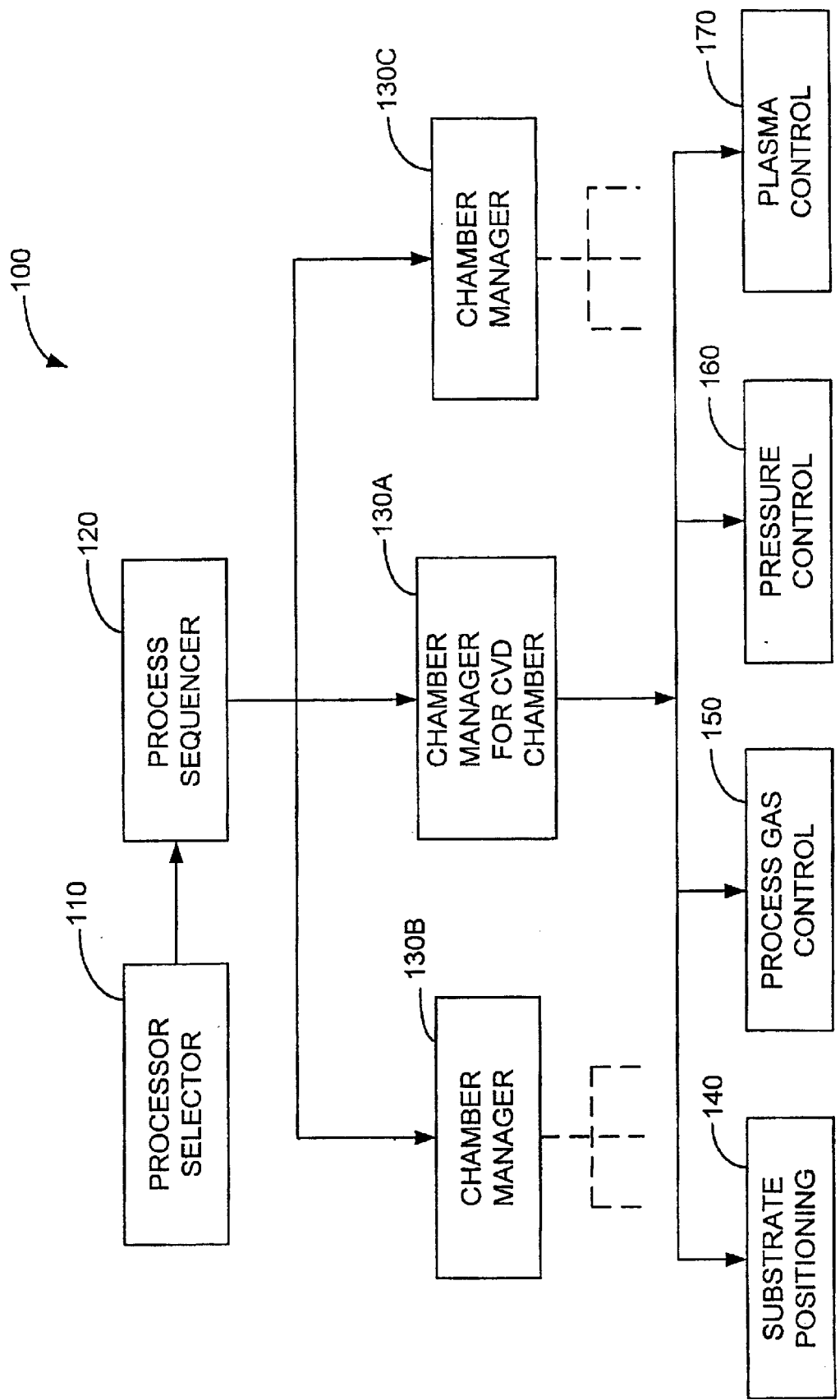
FIG. 1D is a flow chart of an exemplary process control computer program product used to control the exemplary CVD processing chamber of FIG. 1A.

FIG. 1D shows an illustrative block diagram of the hierarchical control structure of computer program 100. A user enters a process set number and process chamber number into a process selector subroutine 110 in response to menus or screens displayed on the CRT monitor by using the light pen interface. The process sets are predetermined sets of process parameters necessary to carry out specified processes, and are identified by predefined set numbers. Process selector subroutine 110 identifies (i) the desired process chamber in a multichamber system, and (ii) the desired set of process parameters needed to operate the process chamber for performing the desired process. The process parameters for performing a specific process relate to conditions such as process gas composition and flow rates, temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog and digital input boards of system controller 60, and the signals for controlling the process are output on the analog and digital output boards of system controller 60.

A process sequencer subroutine 120 comprises program code for accepting the identified process chamber and set of process parameters from the process selector subroutine 110 and for controlling operation of the various process chambers. Multiple users can enter process set numbers and process chamber numbers, or a single user can enter multiple process set numbers and process chamber numbers; sequencer subroutine 120 schedules the selected processes in the desired sequence. Preferably, sequencer subroutine 120 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 120 can be designed to take into consideration the "age" of each particular user-entered request, or the present condition of the process chamber being used in comparison with the desired process conditions for a selected process, or any other relevant factor a system programmer desires to include for determining scheduling priorities.

After sequencer subroutine 120 determines which process chamber and process set combination is going to be executed next, sequencer subroutine 120 initiates execution of the process set by passing the particular process set parameters to a chamber manager subroutine 130A–C, which controls multiple processing tasks in chamber 13 and possibly other chambers (not shown) according to the process set sent by sequencer subroutine 120.

Examples of chamber component subroutines are substrate positioning subroutine 140, process gas control subroutine 150, pressure control subroutine 160, and plasma control subroutine 170. Those having ordinary skill in the art will recognize that other chamber control subroutines can be included depending on what processes are selected to be performed in chamber 13. In operation, chamber manager subroutine 130A selectively schedules or calls the process component subroutines in accordance with the particular process set being executed. Chamber manager subroutine 130A schedules process component subroutines in the same manner that sequencer subroutine 120 schedules the process chamber and process set to execute. Typically, chamber manager subroutine 130A includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIGS. 1A and 1D. Substrate positioning subroutine 140 comprises program code for controlling chamber components that are used to load a substrate onto substrate support number 18. Substrate positioning subroutine 140 may also control transfer of a substrate into chamber 13 from, e.g., a plasma-enhanced CVD ("PECVD") reactor or other reactor in the multi-chamber system, after other processing has been completed.

Process gas control subroutine 150 has program code for controlling process gas composition and flow rates. Subroutine 150 controls the open/close position of the safety shut-off valves and also ramps up/ramps down the mass flow controllers to obtain the desired gas flow rates. All chamber component subroutines, including process gas control subroutine 150, are invoked by chamber manager subroutine 130A. Subroutine 150 receives process parameters from chamber manager subroutine 130A related to the desired gas flow rates.

Typically, process gas control subroutine 150 opens the gas supply lines, and repeatedly (i) reads the necessary mass flow controllers, (ii) compares the readings to the desired flow rates received from chamber manager subroutine 130A, and (iii) adjusts the flow rates of the gas supply lines as necessary. Furthermore, process gas control subroutine 150 may include steps for monitoring the gas flow rates for unsafe rates and for activating the safety shut-off valves when an unsafe condition is detected.

In some processes, an inert gas, such as argon, is flowed into chamber 13 to stabilize the pressure in the chamber before reactive process gases are introduced. For these processes, the process gas control subroutine 150 is programmed to include steps for flowing the inert gas into chamber 13 for an amount of time necessary to stabilize the pressure in the chamber. The steps described above may then be carried out.

Additionally, when a process gas is to be vaporized from a liquid precursor, for example, tetraethylorthosilane (TEOS), the process gas control subroutine 150 may include steps for bubbling a delivery gas such as helium through the liquid precursor in a bubbler assembly or for introducing the helium to a liquid injection valve. For this type of process, the process gas control subroutine 150 regulates the flow of the delivery gas, the pressure in the bubbler, and the bubbler temperature to obtain the desired process gas flow rates. As discussed above, the desired process gas flow rates are transferred to process gas control subroutine 150 as process parameters.

Furthermore, the process gas control subroutine 150 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The process gas control subroutine 150 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine 160 includes program code for controlling the pressure in chamber 13 by regulating the size of the opening of throttle valve 26 in the exhaust portion of the chamber. There are at least two basic methods of controlling the chamber with the throttle valve. The first method relies on characterizing the chamber pressure as it relates to, among other things, the total process gas flow, the size of the process chamber, and the pumping capacity. The first method sets throttle valve 26 to a fixed position. Setting throttle valve 26 to a fixed position may eventually result in a steady-state pressure.

Alternatively, the chamber pressure may be measured, with a manometer for example, and the position of throttle valve 26 may be adjusted according to pressure control subroutine 160, assuming the control point is within the boundaries set by gas flows and exhaust capacity. The former method may result in quicker chamber pressure changes, as the measurements, comparisons, and calculations associated with the latter method are not invoked. The former method may be desirable where precise control of the chamber pressure is not required, whereas the latter method may be desirable where an accurate, repeatable, and stable pressure is desired, such as during the deposition of a layer.

When pressure control subroutine 160 is invoked, the desired, or target, pressure level is received as a parameter from chamber manager subroutine 130A. Pressure control subroutine 160 measures the pressure in chamber 13 by reading one or more conventional pressure manometers connected to the chamber; compares the measured value(s) to the target pressure; obtains proportional, integral, and differential (PID) values from a stored pressure table corresponding to the target pressure, and adjusts throttle valve 26 according to the PID values obtained from the pressure table. Alternatively, pressure control subroutine 160 may open or close throttle valve 26 to a particular opening size to regulate the pressure in chamber 13 to a desired pressure or pressure range.

Plasma control subroutine 170 comprises program code for controlling the frequency and power output setting of RF generators 31A and 31B and for tuning matching networks 32A and 32B. Plasma control subroutine 370, like the previously described chamber component subroutines, is invoked by chamber manager subroutine 330A.

An example of a system that may incorporate some or all of the subsystems and routines described above would be the ULTIMA™ system, manufactured by APPLIED MATERIALS, INC., of Santa Clara, Calif., configured to practice the present invention. Further details of such a system are disclosed in the copending, commonly assigned U.S. patent application Ser. No. 08/679,927, filed Jul. 15, 1996, entitled "Symmetric Tunable Inductively-Coupled HDP-CVD Reactor," having Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha listed as co-inventors, the disclosure of which is incorporated herein by reference. The described system is for exemplary purpose only. It would be a matter of routine skill for a person of skill in the art to select an appropriate conventional substrate processing system and computer control system to implement the present invention.

III. Exemplary FSG Depostion

Figure 2:
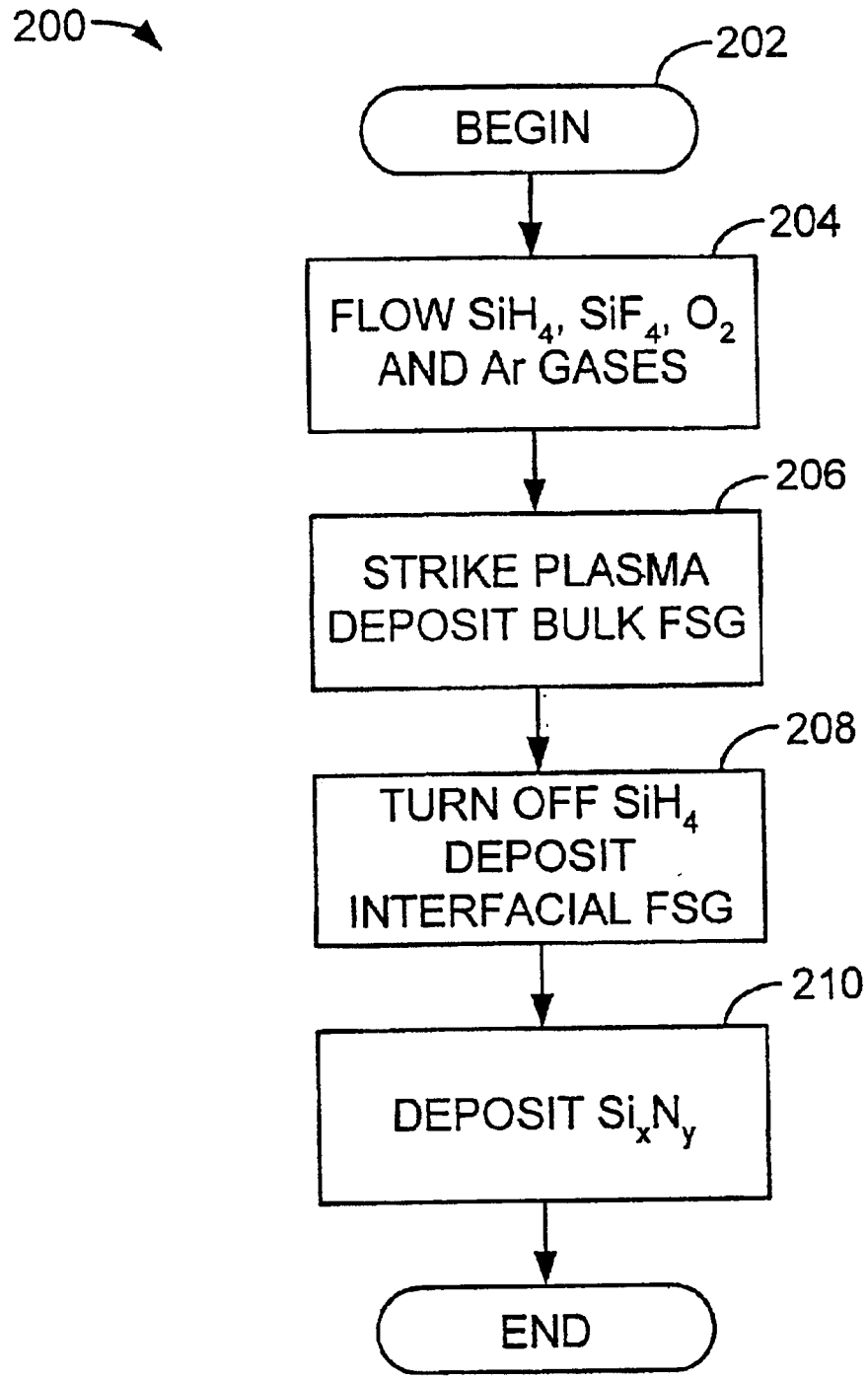
FIG. 2 is a flow diagram of a first embodiment of the method of the present invention.
Figure 3:
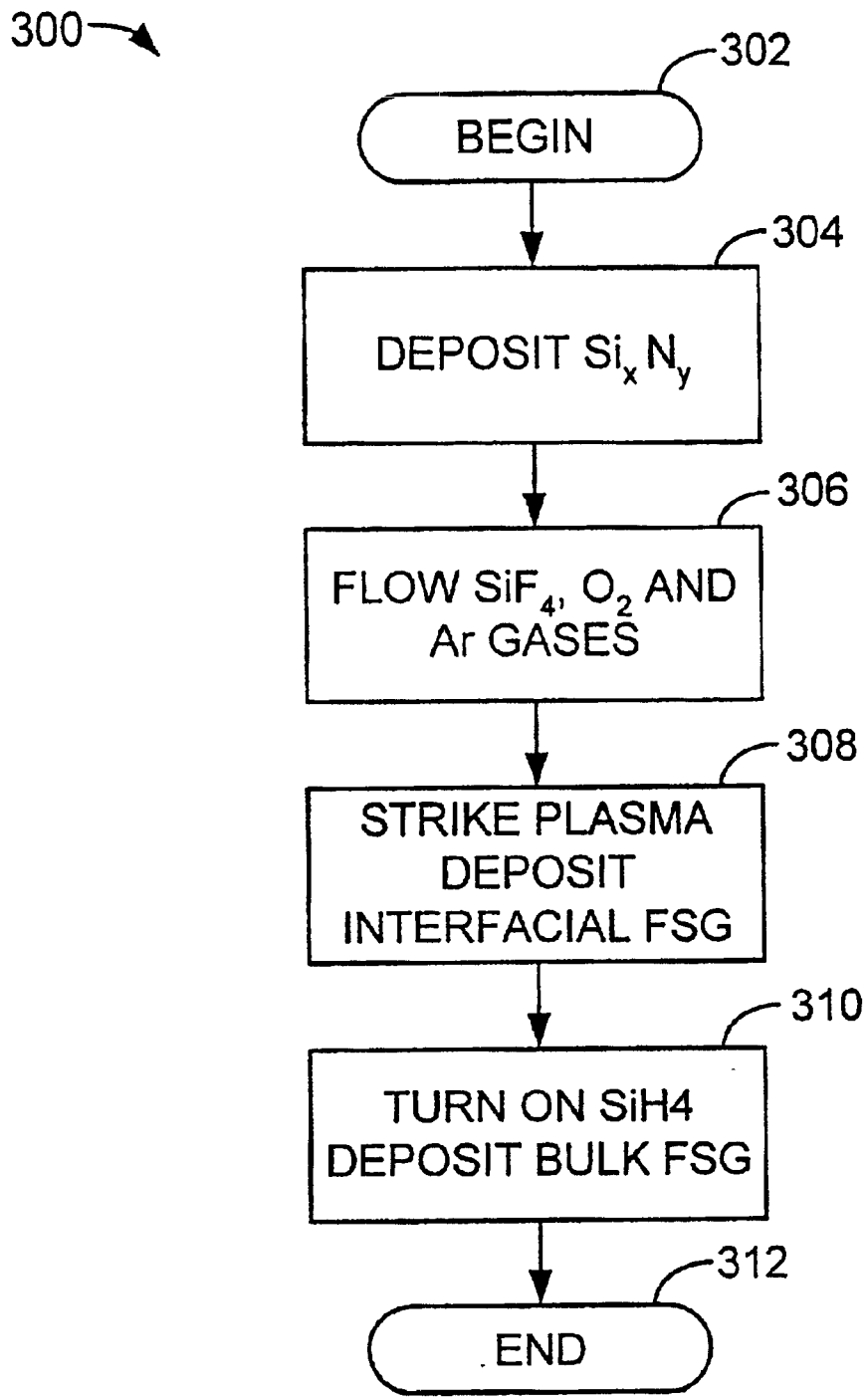
FIG. 3 is flow diagram of a second embodiment of the method of the present invention.
Figure 4A:
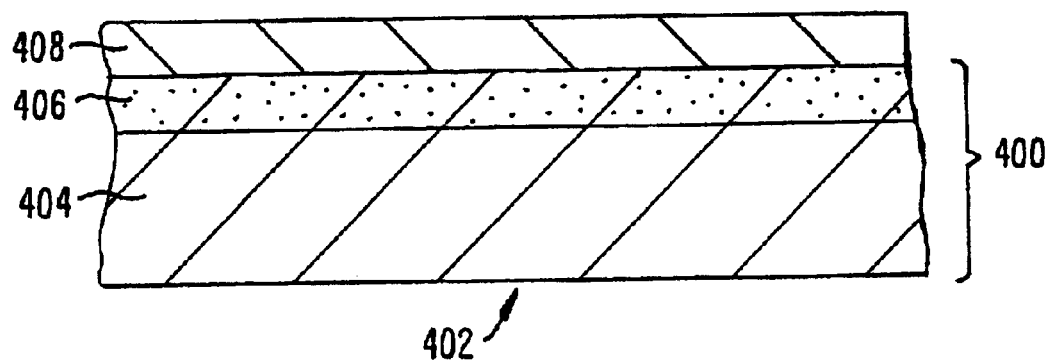
FIG. 4(a) is a cross-sectional view of a dielectric thin film deposited according to the first embodiment of the method of the present invention.
Figure 4B:
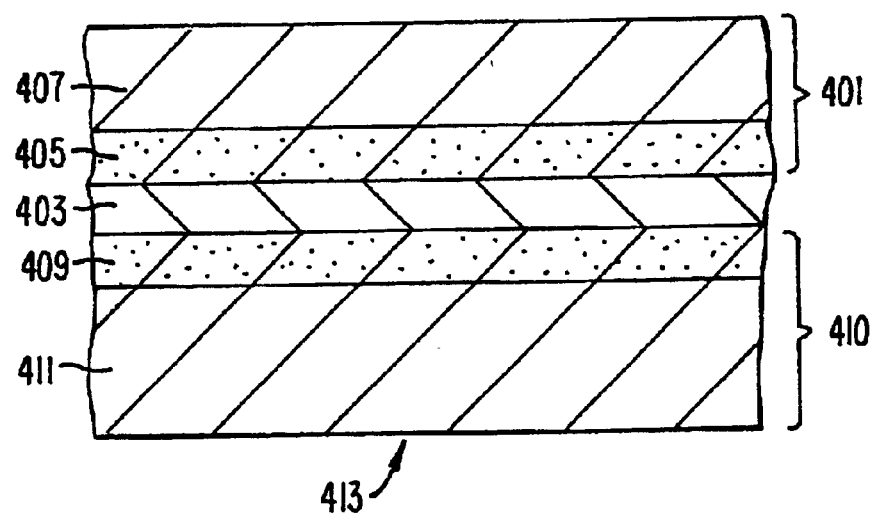
FIG. 4(b) is a cross-sectional view of a dielectric thin film deposited according to the second embodiment of the method of the present invention.

The present invention unexpectedly improves adhesion of HDP-FSG to overlying or underlying silicon nitride ($Si_xN_y$). The method is best understood with reference to FIGS. 2, 3, 4(a) and 4(b). FIGS. 2 and 3 depict first and second embodiments of the method of the present invention. FIGS. 4(a) and 4(b) represent dielectric films deposited using the first and second embodiments respectively.

The first embodiment of the method is best understood by simultaneously referring to FIGS. 2 and 4(a). FIG. 2 depicts a flow diagram for depositing an FSG film 400 having improved adhesion to a subsequently deposited overlying $Si_xN_y$ layer 408. The method 200 begins at 202. At step 204 a gaseous mixture containing flows of $SiH_4$, $SiF_4$, $O_2$, and Ar is introduced to a process chamber such as chamber 13. Flow rates for the deposition gases range from 20 to 60 standard cubic centimeters per minute (sccm) for $SiH_4$, from 20 to 40 sccm for $SiF_4$, from 200 to 400 sccm for $O_2$, and from 100 to 400 sccm for Ar. The chamber pressure is typically maintained at between 4 and 10 millitorr. The chamber wall temperature is typically maintained at between 100° C. and 170° C.

The gaseous mixture is energized at step 206 to form a plasma for depositing FSG on a substrate 402 such as silicon. Preferably, the plasma is a high density plasma (HDP), i.e. a plasma having an ion density of approximately $10^{11}$ ions/cm$^3$ or greater. Bias power is not normally used in the deposition process. Usually, only source RF power is used for plasma generation and deposition and substrate temperature control. For example, in an HDP chamber such as chamber 13, between 1500 and 4800 watts of RF power are applied to top coil 29 and between 2500 and 4800 watts are applied to side coil 30.

The substrate temperature is typically maintained at between 350 and 450° C. during FSG deposition. In one embodiment, the substrate is heated with the plasma using source RF power only. In another embodiment, a low bias RF power (i.e., up to 500 watts) can be used for deposition temperature control using a closed loop with backside emissivity wafer temperature control. For example, a low bias power (up to 300 W for 200 mm wafers or ~1.0 W/cm$^2$) is sometimes used to heat-up epitaxial silicon (epi) wafers to the desired temperature during the process. Because of their low resistivity, epi wafers cannot be heated with only source RF and a bias RF is necessary to help in heating up the wafer to the desired temperature. In addition, back side He cooling may optionally be used for process temperature control and targeting.

After a bulk portion 404 of FSG film 400 has been deposited, the flow of $SiH_4$ is stopped at step 208. An interfacial portion of the FSG film, i.e., a topmost portion 406 in FIG. 4(a) is then deposited using $SiF_4$, $O_2$ and Ar. Without the $SiH_4$, less hydrogen is available to be incorporated into the interfacial portion of the FSG film. The flow rates of the other gases are not normally changed when the flow of $SiH_4$ is stopped, although it may be desirable to adjust some or all of these flow rates to maintain a constant flow-rate concentration.

The interfacial portion 406 need not be very thick compared to the overall film thickness. In one exemplary embodiment interfacial portion 406 may amount to about 1500 Å out of a total FSG film 400 approximately 10,000 Å thick. Once interfacial portion 406 has been deposited, a layer of $Si_xN_y$ 408 is deposited on top of the FSG layer 400, i.e. on top of the interfacial portion 406 at step 210. $Si_xN_y$ layer 408 can be deposited by any conventional means including PECVD and HDP-CVD. However, from a standpoint of process integration, it is more convenient in some embodiments to deposit the $Si_xN_y$ in the same chamber as the FSG deposition. Thus, if, for example, the FSG layer is deposited in an HDP-CVD chamber, it is convenient to deposit the $Si_xN_y$ layer by HDP-CVD in the same chamber. The $Si_xN_y$ can be deposited on top of the FSG to any desired thickness, but adhesion generally worsens as the $Si_xN_y$ thickness increases.

FIGS. 3 and 4(b) depict a second embodiment of the method of the present invention wherein an FSG layer 401, having an interfacial portion 405 and bulk portion 407 is deposited on a substrate 413 over a layer of $Si_xN_y$ 403. The method 300 begins at step 302. $Si_xN_y$ 403 layer is deposited on the substrate 413 at step 304. As in the first embodiment, $Si_xN_y$ layer 403 may be deposited by conventional means including HDP-CVD and PECVD. Furthermore, substrate 413 may include a previously deposited FSG layer 410 having a bulk layer 411 and an interfacial layer 409. After depositing $Si_xN_y$ layer 403, a gaseous mixture containing flows of $SiF_4$, $O_2$, and Ar, but not $SiH_4$, is introduced to a process chamber containing substrate 413 at step 306. Flow rates for the deposition gases range from 20 to 40 sccm for $SiF_4$, from 200 to 400 sccm for $O_2$, and from 100 to 400 sccm for Ar. As discussed above, in some embodiments, it is desirable, from a process integration standpoint, to deposit both $Si_xN_y$ layer 403 and FSG layer 401 in the same chamber.

The gaseous mixture is energized at step 308 to form a plasma for depositing interfacial portion 405 of FSG layer

401. Preferably, the plasma is a high-density plasma (HDP). Interfacial portion 405 of FSG film 401, i.e., the lowermost portion, is then deposited using $SiF_4$, $O_2$, and Ar. Source RF power, bias RF power, chamber pressure, chamber temperature, and substrate temperature are generally maintained within the ranges set forth above with respect to the first embodiment. Without the $SiH_4$, essentially no hydrogen is available to be incorporated into the interfacial portion 405 of FSG film 401. Interfacial portion 405 need not be very thick compared to the overall desired thickness of FSG film 401. In one exemplary embodiment the interfacial portion amounts to about 1500 Å out of a total FSG film thickness of approximately 10,000 Å. Following deposition of interfacial portion 405, a flow of $SiH_4$ is added to the other gas flows at a rate of 10–60 sccm to deposit the bulk of the FSG layer at step 310 as described above with respect to FIG. 2. The flow rates of the other gases are not normally changed when the flow of $SiH_4$ is introduced although it may be desirable to adjust these flow rates to maintain a constant deposition rate.

Step 310 is optional if it is desired to deposit the entire FSG layer 401 without using $SiH_4$, i.e. to deposit a pure SOFO layer. For example, if a sufficiently thin FSG layer is to be disposed between two $Si_xN_y$ barrier layers, it would be desirable to have an interfacial layer at both the bottom and the top of the FSG layer. Rather than deposit the middle of the FSG layer using $SiF_4$ with $SiH_4$, it may be simpler to deposit the whole layer using $SiF_4$ without $SiH_4$.

IV. Exemplary Structures

Figure 5:
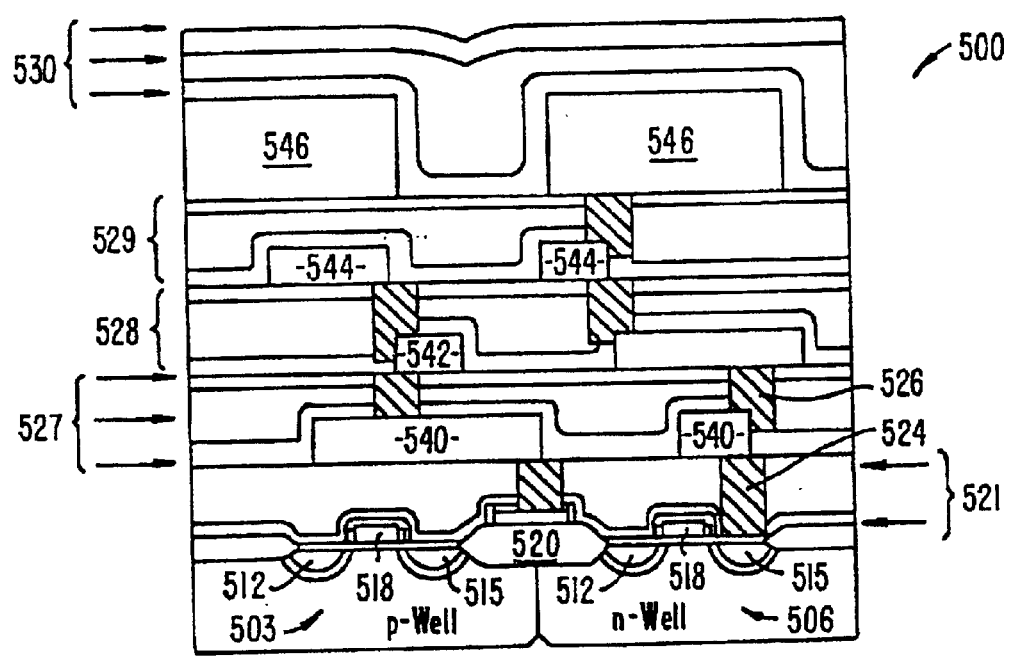
FIG. 5 shows a simplified cross-sectional view of a semiconductor device manufactured according to the method of the present invention.
Figure 6A:
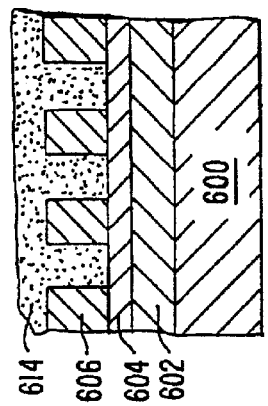
FIGS. 6(a)–6(h) depict a cross section of a partially formed integrated circuit undergoing an integrated dual-damascene process according to an embodiment of the present invention.
Figure 6B:
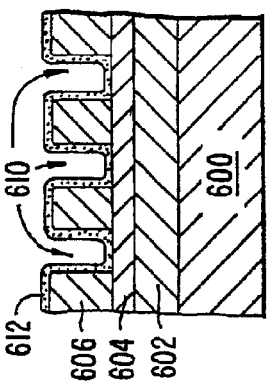
Figure 6C:
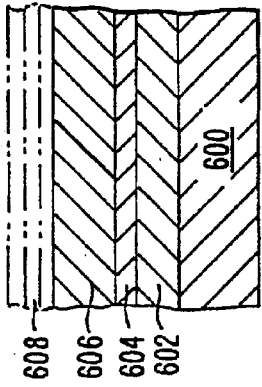
Figure 6D:
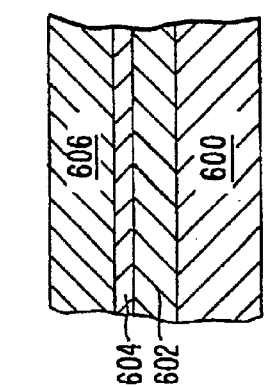
Figure 6E:
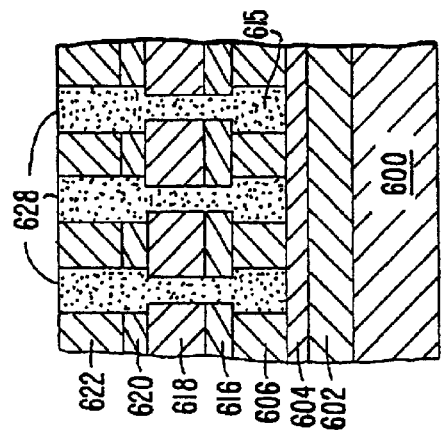
Figure 6F:
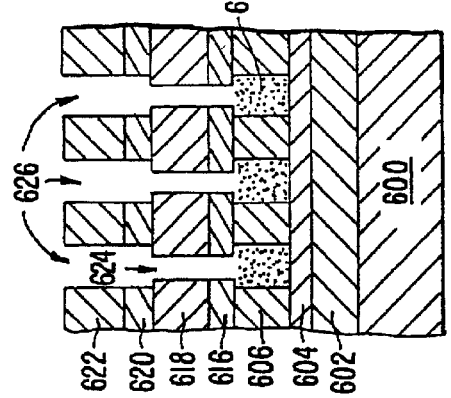
Figure 6G:
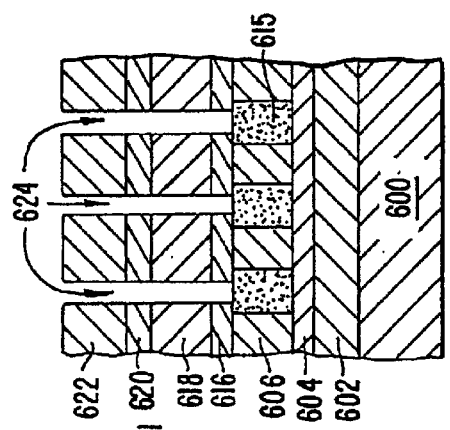
Figure 6H:
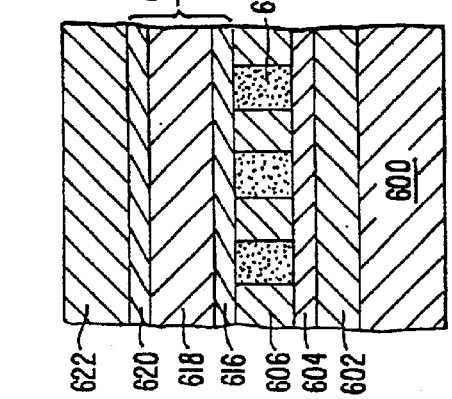

FIG. 5 illustrates a simplified cross-sectional view of an integrated circuit 500, which may be made in accordance with use of the present invention. As shown, integrated circuit 500 includes NMOS and PMOS transistors 503 and 506, which are separated and electrically isolated from each other by a field oxide region 520 formed by local oxidation of silicon ("LOCOS"), or other technique. Alternatively, transistors 503 and 506 may be separated and electrically isolated from each other by a groove trench isolation (not shown) when transistors 503 and 506 are both NMOS or both PMOS. Each transistor 503 and 506 comprises a source region 512, a drain region 515 and a gate region 518.

A premetal dielectric (PMD) layer 521 separates transistors 503 and 506 from metal layer 540 with connections between metal layer 540 and the transistors made by contacts 524. Metal layer 540 is one of four metal layers, 540, 542, 544, and 546, included in integrated circuit 500. Each metal layer 540, 542, 544, and 546 is separated from adjacent metal layers by respective intermetal dielectric (IMD) layers 527, 528, or 529. Any or all of IMD layers 527, 528, or 529 can be deposited in accordance with embodiments of the present invention. Adjacent metal layers are connected at selected openings by vias 526. Deposited over metal layer 546 are planarized passivation layers 530.

It should be understood that simplified integrated circuit 500 is for illustrative purposes only. One of ordinary skill in the art could implement use of the present invention in relation to fabrication of other integrated circuits such as microprocessors, application specific integrated circuits (ASICs), memory devices, and the like. Further, the present invention may be applied to PMOS, NMOS, CMOS, bipolar, or BiCMOS devices.

V. Exemplary Damascene Process

An example of a dual-damascene process integration scheme that uses the SOFO layer deposition of the present invention in forming an IMD layer is depicted in FIGS. 6(*a*)–6(*h*). The dual damascene process begins with the deposition of an oxide layer 602 over a silicon substrate 600 as shown in FIG. 6(*a*). A barrier layer 604 is deposited over oxide layer 602, e.g., by HDP-CVD using $SiH_4$ and $N_2$ or PECVD using $SiH_4+NH_3/N_2$. In some applications layer 604 acts as a hardmask or etch-stop layer. A first SOFO layer 606 is deposited, e.g., using the HDP-CVD method described above. First SOFO layer 606 may be deposited in the same chamber as barrier layer 604 to enhance process integration. A first patterned photoresist layer 608 covers SOFO layer 606 during a first photolithography as shown in FIG. 6(*b*). A first etch forms a first set of gaps 610 in first SOFO layer 606 down to hardmask layer 604 as shown in FIG. 6(*c*).

After the first etch, photoresist 608 is stripped, e.g., by ashing in an oxidizing environment. Gaps 610 and first SOFO layer 606 are then covered with a layer of metal, such as aluminum or copper. In the case of copper, a seed layer 612 (FIG. 6(*c*)) is deposited over gaps 610 and first SOFO layer 606. A first bulk copper layer 614 is deposited to fill the gaps 610 as shown in FIG. 6(*d*). In some applications, a barrier layer (not shown) is deposited over first SOFO layer 606 and gaps 610 prior to deposition of seed layer 612. The barrier layer prevents interdiffusion of copper and SOFO. Copper layer 614 is planarized, e.g., by chemical and mechanical polishing (CMP). Planarization of copper layer 614 forms, e.g., a first set of metal lines 615 in an interconnect structure.

After planarization, of copper layer 614, a second barrier layer 616, a second SOFO layer 618, a third barrier layer 620 and third SOFO layer 622 are deposited to form an IMD layer 621 as shown in FIG. 6(*e*). Second SOFO layer 618 and third SOFO layer 622 may be deposited by HDP-CVD as described above. Layers 618, 620, and 622 may be deposited in the same chamber, e.g., by HDP-CVD, without removing substrate 600 to enhance process integration for forming IMD layer 621. To prevent oxidation of copper layer 620 and contamination of the chamber, substrate 600 may be heated in a high-density argon plasma without oxygen prior to depositing second FSG layer 618. A second lithography and etch forms vias 624 through layers 616, 618, 620 and 622 down to copper layer 614 as shown in FIG. 6(*f*). In FIG. 6(*g*), a third lithography and etch forms a second set of gaps 626. Gaps 626 define a second set of metal lines and vias 624 define a set of interconnects between the second set of metal lines and the first set of metal lines defined by gaps 610 and copper layer 614. Vias 624 and gaps 626 are then filled with a second bulk copper layer and the resulting structure is annealed and planarized as shown in FIG. 6(*h*). Gaps 626 define a second set of metal lines 628 and vias 624 define a set of interconnects 625 between the second set of metal lines 628 and the first set of metal lines 615.

Damascene processes are used in devices that use copper interconnects because there is currently no acceptable way to etch copper. Structures formed by damascene processes do not require a gap-fill dielectric and generally provide lower RC delays than similar structures formed using metal lines aluminum, tungsten, titanium or other metals. Furthermore, higher deposition rates may be used in damascene processes since gap-fill is not an issue. Any of barrier layers 604, 616 and 620 can be silicon nitride layers. As will further be understood by those of skill in the art, each of SOFO layers 604, 618, and 622 may alternatively be replaced with $SiH_4$-FSG layers that include a $SiIF_4$-only interfacial FSG portion as described above. Furthermore, it may also be alternatively desirable to deposit one or more of barrier layers 606, 616 and 620 as silicon-carbon low-k barrier layers such as BLOKTh™ (Barrier Low K). BLOK™ is a trademark of Applied Materials, Inc. of Santa Clara, Calif.

VI. Experimental Results

Experimental results have demonstrated that it is possible to achieve good adhesion between FSG films and barrier layers such as silicon nitride using this method. In addition to this unexpected result, the dielectric constant of SOFO films is found to be reduced when compared with FSG films, making them preferable over $SiH_4$-FSG films in some applications. Various experimental results are tabulated in Tables I through IV. Each table shows adhesion results for silicon wafers having capping layers including $Si_xN_y$ and FSG deposited under different conditions. After the capping layer was deposited, the wafers were heated to temperatures of up to 500° C. and tested for adhesion. Adhesion was rated on a scale of 1 to 10 with lower numbers representing better adhesion and higher numbers representing poorer adhesion. The scale value was assigned to each result through visual examination of the wafers. Those results assigned a scale value of "1" showed substantially no bubbles, while a scale value of "10" would correspond to substantially the entire volume being occupied by bubbles. At a scale value of "5," approximately 50% of the volume was occupied by bubbles. Intermediate scale values showed intermediate volume fractions occupied by bubbles. Wafers having FSG films deposited using an $SiF_4$-based process, i.e., without $SiH_4$, for at least the interface portion of the FSG deposition, passed the test for adhesion to $Si_xN_y$ after being heated to temperatures of up to 500° C. These results were independent of the thickness of the $Si_xN_y$ layer at least up to a thickness of 5000 Å. Furthermore, these results were independent of whether the $Si_xN_y$ was deposited by HDP or PECVD.

In Tables I–IV, the following notation is used: a "SOFO process" refers to HDP CVD deposition of FSG using $SiF_4$ without $SiH_4$. "SRO" refers to an undoped silicon-rich oxide. "UFO 6%" refers to unbiased fluorinated oxide containing 6% fluorine. "Low ρ wafer" (see Table III) refers to a low-resistivity wafer.

TABLE I

ADHESION RESULTS FOR DAMASCENE SOFO AND $SiH_4$-FSG PROCESSES

| Gas Flows (sccm) | | | | Power (W) | | | | Cap | |
|---|---|---|---|---|---|---|---|---|---|
| Ar | $O_2$ | $SiF_4$ | $SiH_4$ | Top | Side | Bias | Conditions | layer | Scale |
| 290 + 38 | 200 | 24 | 0 | 4200 | 4800 | 0 | SOFO | 1 | 1 |
| 290 + 38 | 200 | 24 | 0 | 4200 | 4800 | 0 | SOFO | 2 | 1 |
| 290 + 38 | 200 | 24 | 0 | 4200 | 4800 | 0 | 800-Å SRO + SOFO | 1 | 1 |
| 290 + 38 | 200 | 24 | 0 | 4200 | 4800 | 0 | 800-Å SRO + SOFO | 2 | 1 |
| 290 + 38 | 200 | 24 | 0 | 4200 | 4800 | 300 | SOFO w/bias | 1 | 1 |
| 290 + 38 | 200 | 24 | 0 | 4200 | 4800 | 300 | SOFO w/bias | 2 | 1 |
| 290 + 38 | 200 | 24 | 0 | 4200 | 4800 | 300 | 800-Å SRO + SOFO w/bias | 1 | 1 |
| 290 + 38 | 200 | 24 | 0 | 4200 | 4800 | 300 | 800-Å SRO + SOFO w/bias | 2 | 1 |
| 110 + 16 | 156 | 38 | 44 + 9.5 | 1800 | 4800 | 400 | UFO 6% w/bias | 1 | 5 |
| 110 + 16 | 156 | 38 | 44 + 9.5 | 1800 | 4800 | 400 | UFO 6% w/bias | 2 | 5 |
| 110 + 16 | 156 | 38 | 44 + 9.5 | 1800 | 4800 | 400 | 800-Å SRO + UFO 6% w/bias | 1 | 2 |
| 110 + 16 | 156 | 38 | 44 + 9.5 | 1800 | 4800 | 400 | 800-Å SRO + UFO 6% w/bias | 2 | 3 |
| 110 + 16 | 156 | 43 | 40 + 9.5 | 1800 | 4800 | 0 | UFO 6.5% | 1 | 4 |
| 110 + 16 | 156 | 43 | 40 + 9.5 | 1800 | 4800 | 0 | 800-Å SRO + UFO 6.5% | 1 | 4 |
| 110 + 16 | 156 | 43 | 40 + 9.5 | 1800 | 4800 | 500 | UFO 6.5% w/bias | 1 | 8 |
| 110 + 16 | 156 | 43 | 40 + 9.5 | 1800 | 4800 | 500 | 800-Å SRO + UFO 6.5% w/bias | 1 | 6 |
| 110 + 16 | 156 | 43 | 40 + 9.5 | 1800 | 4800 | 0 | UFO 6.5% | 2 | 7 |
| 110 + 16 | 156 | 43 | 40 + 9.5 | 1800 | 4800 | 0 | 800-Å SRO + UFO 6.5% | 2 | 5 |
| 110 + 16 | 156 | 43 | 40 + 9.5 | 1800 | 4800 | 500 | UFO 6.5% w/bias | 2 | 8 |
| 110 + 16 | 156 | 43 | 40 + 9.5 | 1800 | 4800 | 500 | 800-Å SRO + UFO 6.5% | 2 | 8 |

In Table I, two types of capping layers were used. Cap layer "1" included a 10,000-Å FSG layer deposited by HDP-CVD followed by a 500-Å HDP-CVD $Si_xN_y$ barrier layer covered by a 7500-Å HDP FSG layer. Cap layer "2" included a 10,000-Å HDP FSG layer covered by a 5000-Å HDP $Si_xN_y$ layer. Note also that two numbers appear for the Ar and $SiH_4$ gas flow rates. The first number represents the flow rate of gas through the inlets in the side of the chamber. The second number represents the flow rate of gas through inlets in the top of the chamber. As seen from the table, the best adhesion performance was obtained for FSG deposition using $SiF_4$ without $SiH_4$, whether or not a bias is applied. The worst performance was obtained with the UFO 6.5% recipe (i.e., unbiased fluorinated oxide containing 6.5% fluorine). Note that the adhesion is somewhat better if the fluorine content is reduced to 6%.

Table III shows tabulated adhesion results for a capping layer having a 10,000-Å HDP FSG layer followed by a 5000-Å PECVD $Si_xN_y$ barrier layer. Once again, the barrier layer was deposited ex situ. In these experiments, the $SiF_4$-weighted processes that used only a small amount of silane again generally obtained better results than $SiH_4$ based FSG deposition processes. Furthermore, the adhesion performance was generally worse with the 5000-Å PECVD-deposited $Si_xN_y$ layer than with the capping layer used in Table II.

TABLE II

ADHESION RESULTS FOR
(10,000- HDP FSG)/(500- PECVD $Si_xN_y$)/(7500- HDP FSG) STRUCTURES

| Gas Flows (sccm) | | | | Power (W) | | | | |
|---|---|---|---|---|---|---|---|---|
| Ar | $O_2$ | $SiF_4$ | $SiH_4$ | Top | Side | Bias | Conditions | Scale |
| 110 + 16 | 156 | 38 | 44 + 9.5 | 1800 | 4800 | 0 | UFO 6% | 1 |
| 110 + 16 | 156 | 38 | 44 + 9.5 | 1800 | 4800 | 0 | 800-Å SRO + UFO 6% | 6 |
| 110 + 16 | 156 | 38 | 44 + 9.5 | 1800 | 4800 | 600 | UFO 6% w/400-W bias | 6 |
| 110 + 16 | 156 | 38 | 44 + 9.5 | 1800 | 4800 | 600 | 800-Å SRO + UFO 6% w/400-W bias | 5 |
| 290 + 38 | 200 | 24 | 8 + 3 | 4200 | 4800 | 0 | 800-Å SRO + small $SiH_4$ w/300-W bias | 2 |
| 290 + 38 | 200 | 24 | 8 + 3 | 4200 | 4800 | 0 | 800-Å SRO + small $SiB_4$ | 2 |
| 110 + 16 | 156 | 38 | 44 + 9.5 | 1800 | 4800 | 400 | UFO 6% (no chuck, cool); low-p wafer | 4 |
| 110 + 16 | 156 | 38 | 44 + 9.5 | 1800 | 4800 | 400 | 800-Å SRO + UFO 6% (no chuck, cool); low-p wafer | 3 |

Table II shows tabulated adhesion results for a capping layer having a 10,000-Å HDP FSG layer followed by a 500-Å PECVD $Si_xN_y$ barrier layer and a 7500-Å HDP FSG layer. The barrier layer was deposited ex situ, i.e., the wafer was removed from the chamber and exposed to ambient atmosphere following the deposition of the 10,000-Å HDP FSG layer. In these experiments, the $SiF_4$-weighted processes that used only a small amount of silane generally obtained better results than $SiH_4$-based FSG deposition processes.

TABLE IV

ANNEALING DATA FOR TOPMOST SOFO LAYERS

| Deposition Condition | Cap layer | Scale |
|---|---|---|
| 800-Å SRO + UFO 6% at 8-kA + SOFO at 2-kA | 1 | 1 |
| 800-Å SRO + UFO 6% at 8-kA + SOFO at 2-kA | 2 | 1 |

TABLE III

ADHESION RESULTS FOR
(10,000-Å HDP FSG)/(500-Å PECVD $Si_xN_y$) STRUCTURES

| Gas Flows (sccm) | | | | Power (W) | | | | |
|---|---|---|---|---|---|---|---|---|
| Ar | $O_2$ | $SiF_4$ | $SiH_4$ | Top | Side | Bias | Conditions | Scale |
| 110 + 16 | 156 | 38 | 44 + 9.5 | 1800 | 4800 | 0 | UFO 6% | 3 |
| 110 + 16 | 156 | 38 | 44 + 9.5 | 1800 | 4800 | 0 | 800-Å SRO + UFO 6% | 3 |
| 110 + 16 | 156 | 38 | 44 + 9.5 | 1800 | 4800 | 600 | UFO 6% w/400-W bias | 3 |
| 110 + 16 | 156 | 38 | 44 + 9.5 | 1800 | 4800 | 600 | 800-Å SRO + UFO 6% w/400-W bias | 3 |
| 290 + 38 | 200 | 24 | 8 + 3 | 4200 | 4800 | 0 | 800-Å SRO + small $SiH_4$ w/300-W bias | 2 |
| 290 + 38 | 200 | 24 | 8 + 3 | 4200 | 4800 | 0 | 800-Å SRO + small $SiH_4$ | 1 |
| 110 + 16 | 156 | 38 | 44 + 9.5 | 1800 | 4800 | 400 | UFO 6% (no chuck, cool); low-p wafer | 3 |
| 110 + 16 | 156 | 38 | 44 + 9.5 | 1800 | 4800 | 400 | 800-Å SRO + UFO 6% (no chuck, cool); low-p wafer | 3 |

TABLE IV-continued

ANNEALING DATA FOR TOPMOST SOFO LAYERS

| Deposition Condition | Cap layer | Scale |
|---|---|---|
| 800-Å SRO + UFO 6% at 7-kA + SOFO at 3-kA | 1 | 1 |
| 800-Å SRO + UFO 6% at 7-kA + SOFO at 3-kA | 2 | 1 |
| 800-Å SRO + UFO 6% at 6-kA + SOFO at 4-kA | 1 | 1 |
| 800-Å SRO + UFO 6% at 6-kA + SOFO at 4-kA | 2 | 1 |
| UFO 6% at 10-kA | 1 | 6 |
| UFO 6% at 10-kA | 2 | 3 |
| 800-Å SRO + UFO 6% at 10-kA | 1 | 5 |
| 800-Å SRO + UFO 6% at 10-kA | 2 | 2 |
| 800-Å SRO + UFO 6% at 8.5-kA + SOFO at 1.5-kA | 1 | 1 |
| 800-Å SRO + UFO 6% at 8.5-kA + SOFO at 1.5-kA | 2 | 1 |

Table IV shows tabulated results for capping layers deposited using an $SiF_4$-based process, i.e., without $SiH_4$, for the topmost portion of a 10,000-Å deposition. The thickness of the topmost portion ranges from 1500 Å to 4000 Å. For comparison, four films were deposited without using an $SiF_4$ process for any portion of the deposition. $Si_xN_y$ caps having two different thicknesses were deposited by HDP-CVD. Cap "1" was 5000-Å thick. Cap "2" was 2000-Å thick. Wafers were annealed for three hours at 400° C. in a nitrogen ambient. In each case, the bias applied was 350 W. It is noteworthy that the best adhesion results were obtained for the FSG deposited using an $SiF_4$-based process for the topmost part of the deposition. It is also of note that the adhesion results do not depend on the thickness of the topmost portion of the FSG film.

In general, the best results were obtained for HDP-FSG films deposited using $SiF_4$ without $SiH_4$ for the entire deposition. The second best results were obtained using HDP-FSG films deposited using $SiF_4$ without $SiH_4$ for the interface portion of the deposition. The third best results were obtained using $SiF_4$ with only a small amount of $SiH_4$ for the entire deposition. It is thus hypothesized that the hydrogen provided by silane acts as an impurity in the FSG film, causing a degradation in stability. This hypothesis is supported by further experimental results establishing a correlation between the hydrogen content of the film and its stability. Measurements of the film thickness, nonuniformity, and refractive index were carried out on a Tencor UV 1250 SE for damascene FSG films prepared using the HDP-CVD process at wafer temperatures in the range of 380–450° C. and at pressures lower than 10 mtorr. The fluorine concentration was measured using Fourier-transform infrared ("FTIR") transmission spectroscopy, which measures fluorine bonded to silicon rather than all of the fluorine in the film. To determine the fluorine concentration, the height of the Si-O stretching peak at 1090 $cm^{-1}$ was divided by the height of the Si-F peak at 937 $cm^{-1}$. This ratio, termed the peak-height ratio ("PHR"), was used to quantify the fluorine concentration. The dielectric constant was measured using a mercury probe. Thermal oxide film with a dielectric constant of 3.9 was used as the reference. Stress measurements were carried out using a Tencor FLX 5200 unit. Integration tests with a silicon nitride liner were carried out by annealing Si/FSG/$Si_xN_y$ multistructured stacks in a tube furnace at different temperatures and times using a nitrogen ambient.

Figure 7:
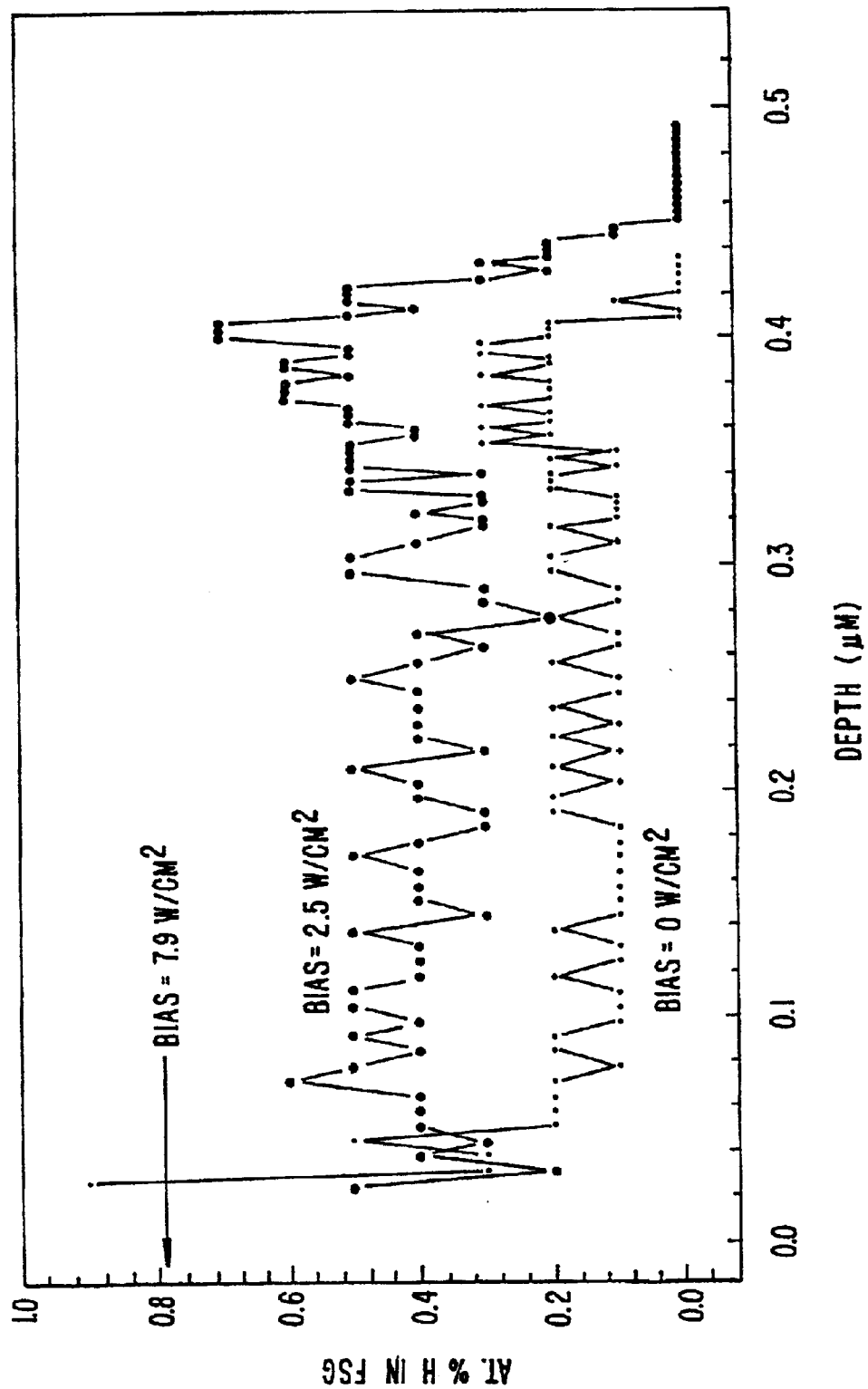
FIG. 7 is a graph showing nuclear-reaction analysis data indicating that the hydrogen content in HDP-CVD fluorinated silicate glass increases with bias.

FIG. 7 shows nuclear-reaction analysis data indicating the increase in H concentration with bias. It can be readily seen that the HDP-CVD reactor acts as a low-energy hydrogen ion implanter when bias is applied, resulting in hydrogen incorporation into the film. The hydrogen concentration in FSG films biased at 7.8 $W/cm^2$, which show poor stability, is approximately 0.8 at. %, but is only 0.1 at. % in unbiased films, which show much better adhesion with $Si_xN_y$. When an intermediate bias of 2.5 $W/cm^2$ is applied, both the adhesive characteristics and the hydrogen concentration in the film are also intermediate.

Integration studies of FSG films with silicon nitride were carried out by fabricating Si/FSG(10,000 Å)/$Si_xN_y$(5,000 Å) multilayer structures and annealing them at 400° C. for 30 minutes per cycle, for a total of 12 cycles. FIG. 8(a) shows clearly the extensive bubbling that results for biased FSG film (800-W bias). This failure is attributed to the hydrogen present in the film, which results from dissociation of $SiH_4$, thereby creating atomic hydrogen and other hydrogen species that are subsequently incorporated into the FSG. These hydrogen species are generally small and not bonded to the $SiO_2$ network. They can diffuse rapidly through the film and react with fluorine to form HF at temperatures greater than 300° C. Since HF is very corrosive, it can weaken the bonds at Si/FSG or FSG/$Si_xN_y$ interfaces, thereby causing delamination and other adhesion issues. While FSG films deposited without bias have lower fluorine concentrations, only a slight improvement in adhesion with silicon nitride was obtained with unbiased processes; significantly better results are obtained by eliminating silane during the deposition process.

Figure 9:
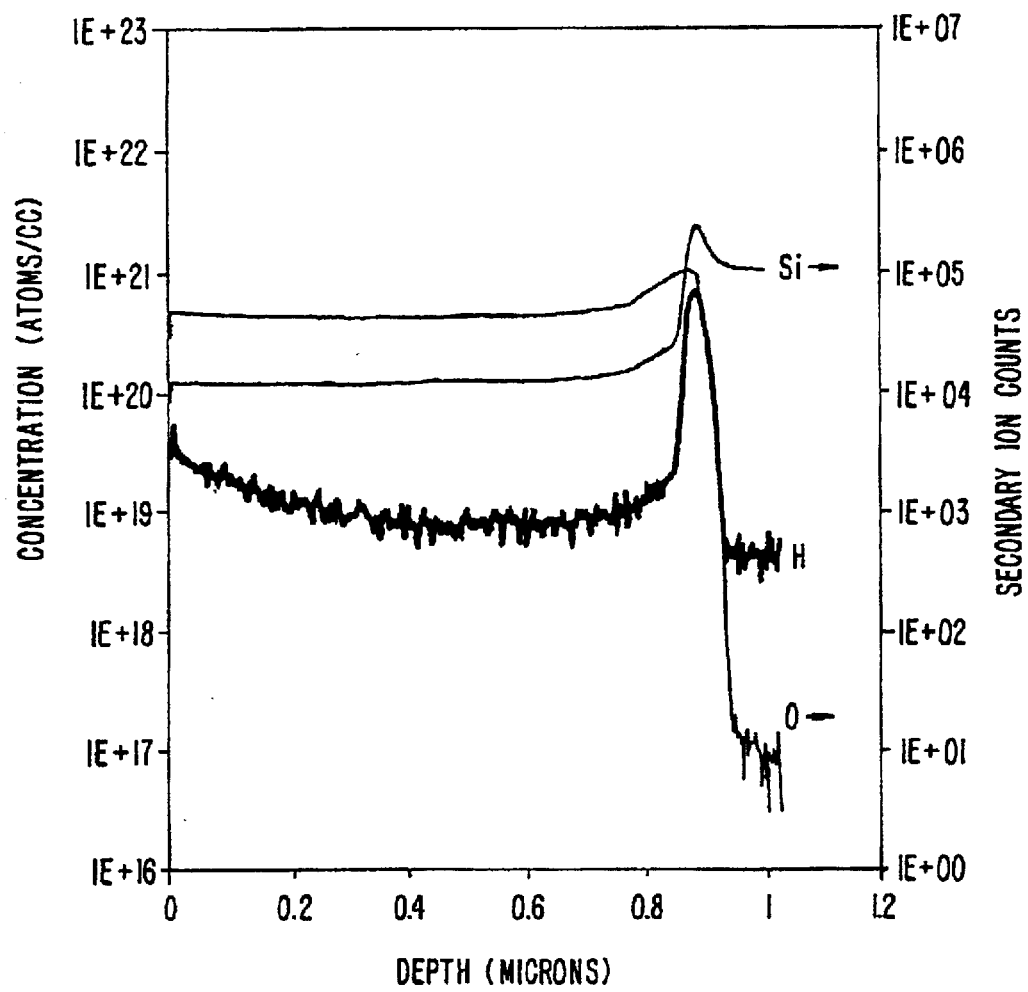
FIG. 9 is a secondary-ion mass-spectroscopy graph showing the atomic hydrogen concentration in unbiased SOFO films to be approximately 0.02%.

FIG. 8(b) shows for comparison integration results with silicon nitride for SOFO film with a bias of 300 W. As seen from the figure, no bubbling or delamination was observed even after 12 annealing cycles. The fluorine concentration for these films was approximately 10 at. %. While the SOFO film should theoretically contain no hydrogen, the secondary-ion mass-spectroscopy ("SIMS") profile displayed in FIG. 9 indicates that it has a hydrogen content of about 0.02 at. %. This small amount of hydrogen, which is notably much less than that observed for silane-based damascene FSG (around 0.1–0.8 at. %), may be due to hydrogen coming from the dissociation of the season layer, which was sputtered from the chamber dome and side walls. To test the stability of fluorine bonded with silicon in the $SiO_2$ network, a Si/PE TEOS USG (8000 Å)/FSG (6000 Å)/PE TEOS USG (8000 Å) type sandwich structure was fabricated and subjected to furnace annealing at 400° C. for 30 minutes per cycle for a total of six cycles in a nitrogen ambient. Different types of FSG films were used and SIMS analysis was subsequently performed on the structures to determine the extent of F diffusion.

Figure 10:
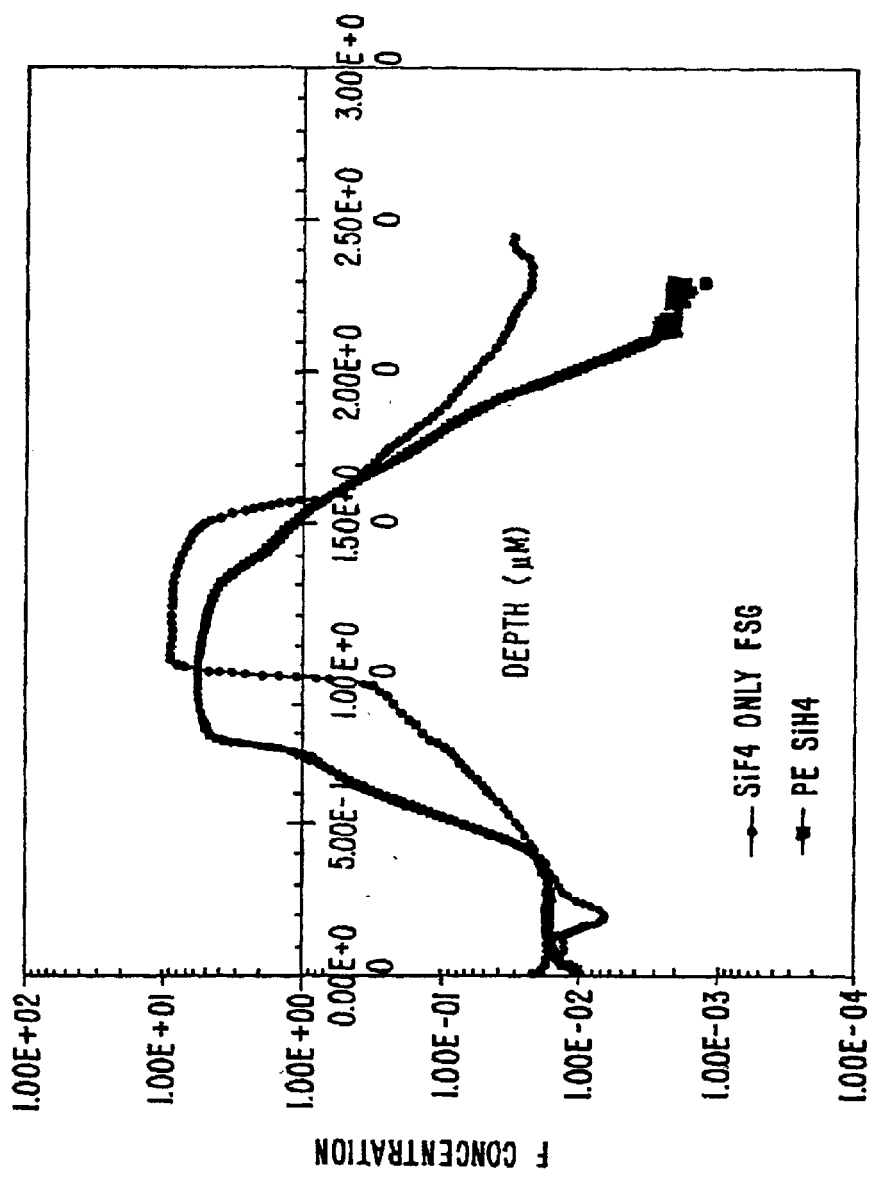
FIG. 10 is a graph showing the fluorine diffusion from SOFO and silane-based plasma-enhanced CVD FSG.

As seen from FIG. 10, the SOFO film had significantly lower F diffusion than an FSG film deposited using the silane-based PECVD technique. In this case, the fluorine concentration in SOFO was 10 at. % while the silane PECVD FSG concentration was 7 at. %. Despite the higher F concentration, SOFO films showed much better bonding integrity than silane-based PECVD FSG. Comparable film properties were obtained with and without bias for the SOFO process, which is significant because of the enhanced robustness that normally results from using bias. In an HDP-CVD chamber, the heat load on the wafer comes from two different sources: radiation heating from the plasma and heat load when bias is applied. For low resistivity epi wafers, heat loss due to high wafer electrical conductivity increases, thereby decreasing the wafer temperature. The heat load from the bias can be used to compensate for this heat loss, thus increasing process robustness. This may be significant in some embodiments since the fluorine concentration depends on wafer temperature.

For an FSG film to be successfully integrated with damascene process flow, the film must withstand etch and ashing processes, and also be compatible with a Ta or TaN metal barrier. Integration of SOFO films with etch, ash processes and with Ta and TaN barriers were also carried out. The SOFO film was etched and subsequently ashed using three different chemistries: $O_2$, $NH_3/O_2$, and $NH_3$. Subsequently, Ta or TaN was deposited on the films, which were then annealed in order to simulate the thermal budget for these structures during subsequent processing, and their stability was determined using confocal microscopic techniques. FIG. 11 shows schematically the entire process flow and the adhesion results. No bubbling or delamination was observed on the Ta or TaN surface after annealing. In general, adhesion of SOFO was better to TaN than to Ta.

Figure 12:
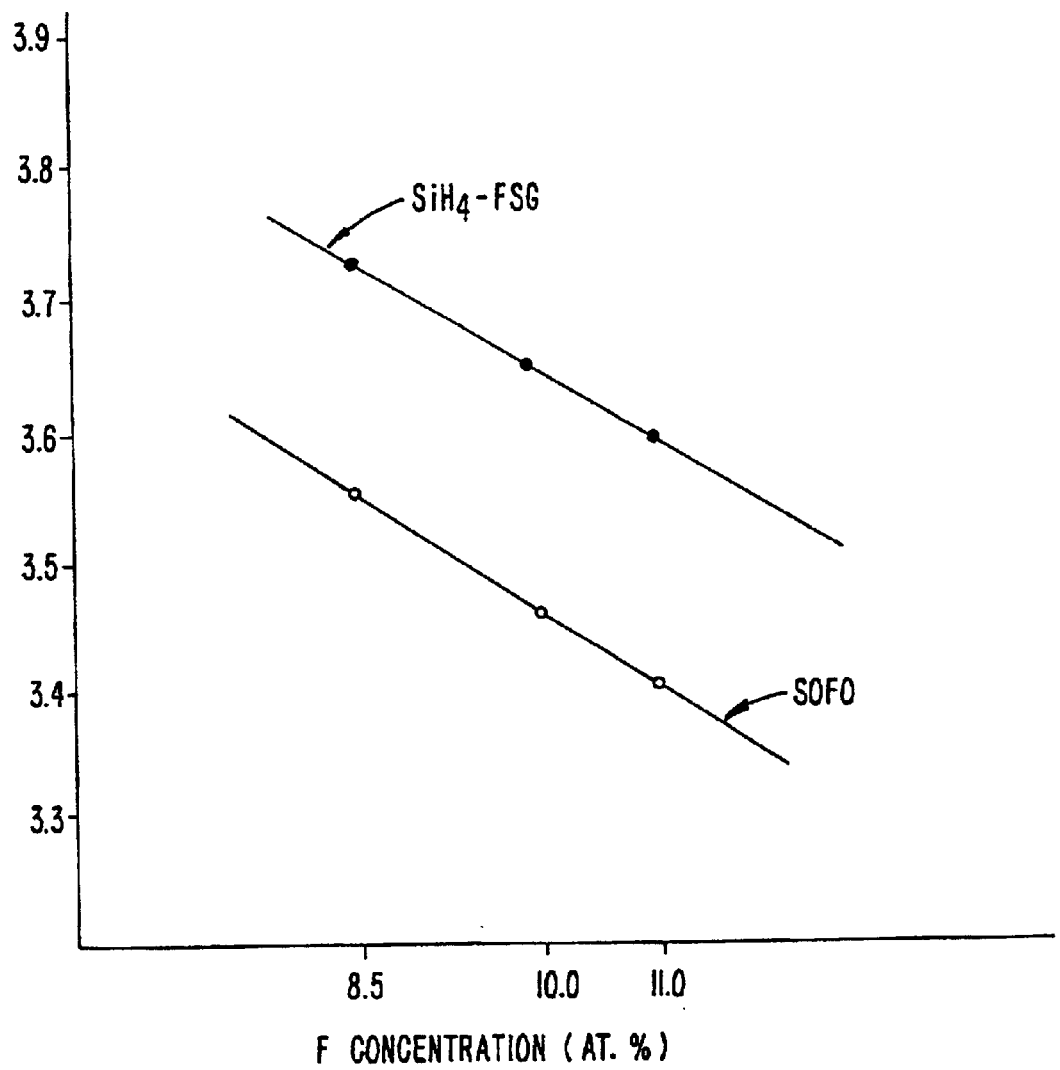
FIG. 12 is a graph comparing the dielectric constant for FSG formed with and without silane as a function of fluorine concentration.

Measurements of the dielectric constant for $SiH_4$-FSG and SOFO are compared in FIG. 12. When $SiH_4$ is removed from the precursor gas mixture, it is evident that even for the same fluorine concentration, the dielectric constant is reduced in SOFO as compared with $SiH_4$ FSG. For example, for the 10 at. % F deposited with $SiH_4$, $SiF_4$, $O_2$, and Ar precursors, the value of k is 3.65. Once $SiH_4$ is removed from the precursor mixture, the value of k is instead measured to be 3.45. Generally, there is a reduction by 0.2 in the relative dielectric constant. Since it is known that impurities in materials have a tendency to increase the dielectric constant, the increase in $SiH_4$-FSG relative to SOFO is readily attributable to the presence of hydrogen impurities in the oxide.

Having fully described several embodiments of the present invention, many other equivalent or alternative methods of depositing the low dielectric constant oxide layer according to the present invention will be apparent to those skilled in the art. These alternatives and equivalents are intended to be included within the scope of the present invention.

What is claimed is:

1. A substrate processing system comprising:
   (a) a housing defining a process chamber;
   (b) a high-density plasma generating system operatively coupled to the process chamber;
   (c) a substrate holder configured to hold a substrate during substrate processing;
   (d) a gas-delivery system configured to introduce gasses into the process chamber;
   (e) a process-control system for maintained a selected pressure within the process chamber;
   (f) a controller for controlling the high-density plasma generating system, the gas-delivery system, and the pressure-control system; and
   (g) a memory coupled to the controller, the memory comprising a computer-readable medium having a computer-readable program embodied therein for directing operation of the substrate processing system, the computer-readable program including:
      (i) instructions to control the gas-delivery system to provide a gaseous mixture to the process chamber, the gaseous mixture comprising a silicon, a gas that contains both fluorine and silicon, and a gas that contains oxygen;
      (ii) instructions to control the high-density plasma generating system to generate a high-density plasma from the gaseous mixture;
      (iii) instructions to control the substrate processing system to deposit a bulk portion of a fluorinated silicone glass layer (FSG) onto the substrate using the high-density plasma;
      (iv) instructions to control the gas-delivery system to terminate the silane flow during deposition of a topmost portion of the FSG layer; and
      (v) instructions to control the substrate processing system to deposit a barrier layer on the topmost portion of the FSG layer.

2. The substrate processing system according to claim 1 wherein the barrier layer comprises nitride.

3. The substrate processing system according to claim 1 wherein the gas that contains both fluorine and silicon is silicon tetrafluoride ($SiF_4$).

4. A substrate processing system comprising:
   (a) a housing defining a process chamber;
   (b) a high-density plasma generating system operatively coupled to the process chamber;
   (c) a substrate holder configured to hold a substrate during substrate processing;
   (d) a gas-delivery system configured to introduce gases into the process chamber;
   (e) a pressure-control system for maintaining a selected pressure within the process chamber;
   (f) a controller for controlling the high-density plasma generating system, the gas-delivery system, and the pressure-control system; and
   (g) a memory coupled to the controller, the memory comprising a computer-readable medium having a computer-readable program embodied therein for directing operation of the substrate processing system, the computer-readable program including:
      (i) instructions to control the gas-delivery system to provide a gaseous mixture to the process chamber, the gaseous mixture comprising flows of a gas that contains both fluorine and silicon and a gas that contains oxygen, but not containing a silane;
      (ii) instructions to control the high-density plasma generating system to generate a high-density plasma from the gaseous mixture;
      (iii) instructions to control the substrate processing system to deposit a first portion of a fluorinated silicate glass (FSG) layer onto a barrier layer that has been deposited on the substrate using the plasma; and
      (iv) instructions to control the gas-delivery system to introduce a flow of silane to the gaseous mixture to deposit a second portion of the FSG layer.

5. The substrate processing system according to claim 4 wherein the barrier layer comprises a silicon nitride layer.

6. The substrate processing system according to claim 4 wherein the gas that contains both fluorine and silicon tetrafluoride ($SiF_4$).

7. The substrate processing system according to claim 4 wherein the computer-readable program further includes:
   (i) instructions for deposition a layer or copper on the substrate; and
   (ii) instructions for heating the substrate in an in situ plasma that does not require an oxygen source.

* * * * *